United States Patent
Sasaki et al.

(10) Patent No.: US 12,100,610 B2
(45) Date of Patent: Sep. 24, 2024

(54) ELECTROSTATIC CHUCK AND PROCESSING APPARATUS

(71) Applicant: TOTO LTD., Kitakyushu (JP)

(72) Inventors: Yuki Sasaki, Kitakyushu (JP); Jun Shiraishi, Kitakyushu (JP); Yutaka Momiyama, Kitakyushu (JP); Reo Kawano, Kitakyushu (JP)

(73) Assignee: Toto Ltd., Kitakyushu (JP)

( * ) Notice: Subject to any disclaimer, the term of this patent is extended or adjusted under 35 U.S.C. 154(b) by 241 days.

(21) Appl. No.: 17/897,417

(22) Filed: Aug. 29, 2022

(65) Prior Publication Data

US 2023/0061208 A1   Mar. 2, 2023

(30) Foreign Application Priority Data

Aug. 31, 2021 (JP) .................................. 2021-141368
Jul. 15, 2022 (JP) .................................. 2022-114206

(51) Int. Cl.
H01L 21/683 (2006.01)

(52) U.S. Cl.
CPC .............................. H01L 21/6833 (2013.01)

(58) Field of Classification Search
CPC ....... H01L 21/683–687; H01L 21/6875; H01L 21/6831–6833; H01L 21/67109; H05K 3/03; H05K 3/0306; H01J 37/12; H01J 37/145–147
USPC ......................................... 361/103, 145, 234
See application file for complete search history.

(56) References Cited

U.S. PATENT DOCUMENTS

| | | | | |
|---|---|---|---|---|
| 6,538,872 | B1 * | 3/2003 | Wang | H01L 21/6833 361/103 |
| 10,026,636 | B2 * | 7/2018 | Makhratchev | H01R 43/16 |
| 10,332,772 | B2 * | 6/2019 | Tantiwong | H01L 21/6833 |
| 10,497,600 | B2 | 12/2019 | Yamaguchi et al. | |
| 2013/0308244 | A1 * | 11/2013 | Shiraiwa | H02N 13/00 361/234 |
| 2014/0202635 | A1 * | 7/2014 | Yamaguchi | H01L 21/6831 279/128 |
| 2016/0276198 | A1 * | 9/2016 | Anada | H01L 21/6831 |
| 2017/0352568 | A1 | 12/2017 | Cho et al. | |
| 2019/0287839 | A1 * | 9/2019 | Yamaguchi | H01L 21/6833 |

FOREIGN PATENT DOCUMENTS

| | | |
|---|---|---|
| JP | 2010-123712 A | 6/2010 |
| JP | 6489277 B1 | 3/2019 |
| JP | 2021-057468 A | 4/2021 |

* cited by examiner

Primary Examiner — Tuan T Dinh
(74) Attorney, Agent, or Firm — Carrier, Shende & Associated P.C.; Joseph P. Carrier; Fulchand P. Shende

(57) ABSTRACT

An electrostatic chuck includes a ceramic dielectric substrate, a base plate, a bonding part, a gas inlet path, a counterbore part, a ceramic porous part, and an elastic body. The base plate supports the ceramic dielectric substrate. The bonding part is located between the ceramic dielectric substrate and the base plate. The gas inlet path extends through the ceramic dielectric substrate, the base plate, and the bonding part. The gas inlet path includes a first hole part, a second hole part and a third hole part. The first hole part is positioned at the ceramic dielectric substrate. The third hole part is positioned at the bonding part. The counterbore part is located in the first hole part. The ceramic porous part is located in the counterbore part. The elastic body faces an end part of the bonding part at the third hole part side.

18 Claims, 12 Drawing Sheets

ELECTROSTATIC CHUCK AND PROCESSING APPARATUS

CROSS-REFERENCE TO RELATED APPLICATIONS

This application is based upon and claims the benefit of priority from Japanese Patent Application No. 2021-141368, filed on Aug. 31, 2021, and No. 2022-114206, filed on Jul. 15, 2022; the entire contents of which are incorporated herein by reference.

FIELD

Embodiments described herein relate generally to an electrostatic chuck and a processing apparatus.

BACKGROUND

An electrostatic chuck that includes an electrode and a ceramic dielectric substrate of alumina or the like clamps a substrate such as a silicon wafer or the like by an electrostatic force by applying electrical power for electrostatic clamping to the electrode. In such an electrostatic chuck, the temperature of the substrate that is the clamping object is controlled by causing an inert gas such as helium (He) or the like to flow between the front surface of the ceramic dielectric substrate and the back surface of the substrate that is the clamping object.

For example, a temperature rise of the substrate may accompany the processing in an apparatus that processes the substrate such as a CVD (Chemical Vapor Deposition) apparatus, a sputtering apparatus, an ion implantation apparatus, an etching apparatus, etc. In an electrostatic chuck used in such an apparatus, the temperature rise of the substrate is suppressed by causing an inert gas such as He or the like to contact the substrate by causing the inert gas to flow between the ceramic dielectric substrate and the substrate that is the clamping object.

In the electrostatic chuck that controls the substrate temperature with an inert gas such as He or the like, a hole (a gas inlet path) for introducing the inert gas such as He or the like is provided in the ceramic dielectric substrate and in a base plate supporting the ceramic dielectric substrate. A through-hole that communicates with the gas inlet path of the base plate is provided in the ceramic dielectric substrate. Thereby, the inert gas that is introduced through the gas inlet path of the base plate passes through the through-hole of the ceramic dielectric substrate and is guided to the back surface of the substrate.

Here, when the substrate is processed inside the apparatus, there are cases where electrical discharge (arcing) occurs from the plasma inside the apparatus toward the base plate that is made of metal. There are cases where the gas inlet path of the base plate and/or the through-hole of the ceramic dielectric substrate easily becomes a path for the electrical discharge. Therefore, there is technology that improves the resistance to arcing (the breakdown voltage, etc.) by providing a porous part in the gas inlet path of the base plate and/or the through-hole of the ceramic dielectric substrate. For example, JP-A 2010-123712 (Kokai) discusses an electrostatic chuck that improves the insulative properties inside the gas inlet path by providing a ceramic sintered porous body inside the gas inlet path and by using membrane pores and the structure of the ceramic sintered porous body as the gas flow path. Also, USP 2017/0352568 discusses an electrostatic chuck in which a ceramic porous body is located in the gas inlet path of the base plate and the through-hole of the ceramic dielectric substrate. Furthermore, in JP-A 2021-057468 (Kokai), a ceramic porous body is located in the gas inlet path of the base plate or the through-hole of the ceramic dielectric substrate, and a protectant material is located at locations where the adhesive layer that bonds the base plate and the ceramic dielectric substrate is exposed in the gas inlet path and/or the through-hole, and it is stated that corrosion of the adhesive is suppressed.

It is desirable for such an electrostatic chuck to maintain the suppression effect of the arcing for a long period of time.

SUMMARY

According to the embodiment, an electrostatic chuck includes a ceramic dielectric substrate, a base plate, a bonding part, a gas inlet path, a counterbore part, a ceramic porous part, and an elastic body. The ceramic dielectric substrate includes a first major surface and a second major surface. An object of clamping is placed on the first major surface. The second major surface is at a side opposite to the first major surface. The base plate supports the ceramic dielectric substrate. the base plate includes an upper surface and a lower surface. The upper surface is at the ceramic dielectric substrate side. The lower surface is at a side opposite to the upper surface. The bonding part is located between the ceramic dielectric substrate and the base plate. The gas inlet path extends through the ceramic dielectric substrate, the base plate, and the bonding part. The gas inlet path includes a first hole part, a second hole part and a third hole part. The first hole part is positioned at the ceramic dielectric substrate. The second hole part is positioned at the base plate. The third hole part is positioned at the bonding part. The counterbore part is located in the first hole part. The ceramic porous part is located in the counterbore part. The ceramic porous part includes a first surface and a second surface. The first surface is at the third hole part side. The second surface is at a side opposite to the first surface. The elastic body faces an end part of the bonding part at the third hole part side. The ceramic porous part further includes a side surface connecting the first surface and the second surface. The side surface includes a first side part, a second side part, and a third side part. The first side part is at the first surface side. The second side part is at the second surface side. The third side part is between the first side part and the second side part. The first direction is a direction from the base plate toward the ceramic dielectric substrate. The second direction is a direction substantially orthogonal to the first direction. A first sloped part is provided in at least a region of the first side part contacting the first surface. The first sloped part is sloped with respect to the first direction. The first surface overlaps the bonding part and the elastic body when viewed along the second direction. The ceramic porous part is configured to contact the elastic body at the first sloped part.

DETAILED DESCRIPTION

Figure 1:
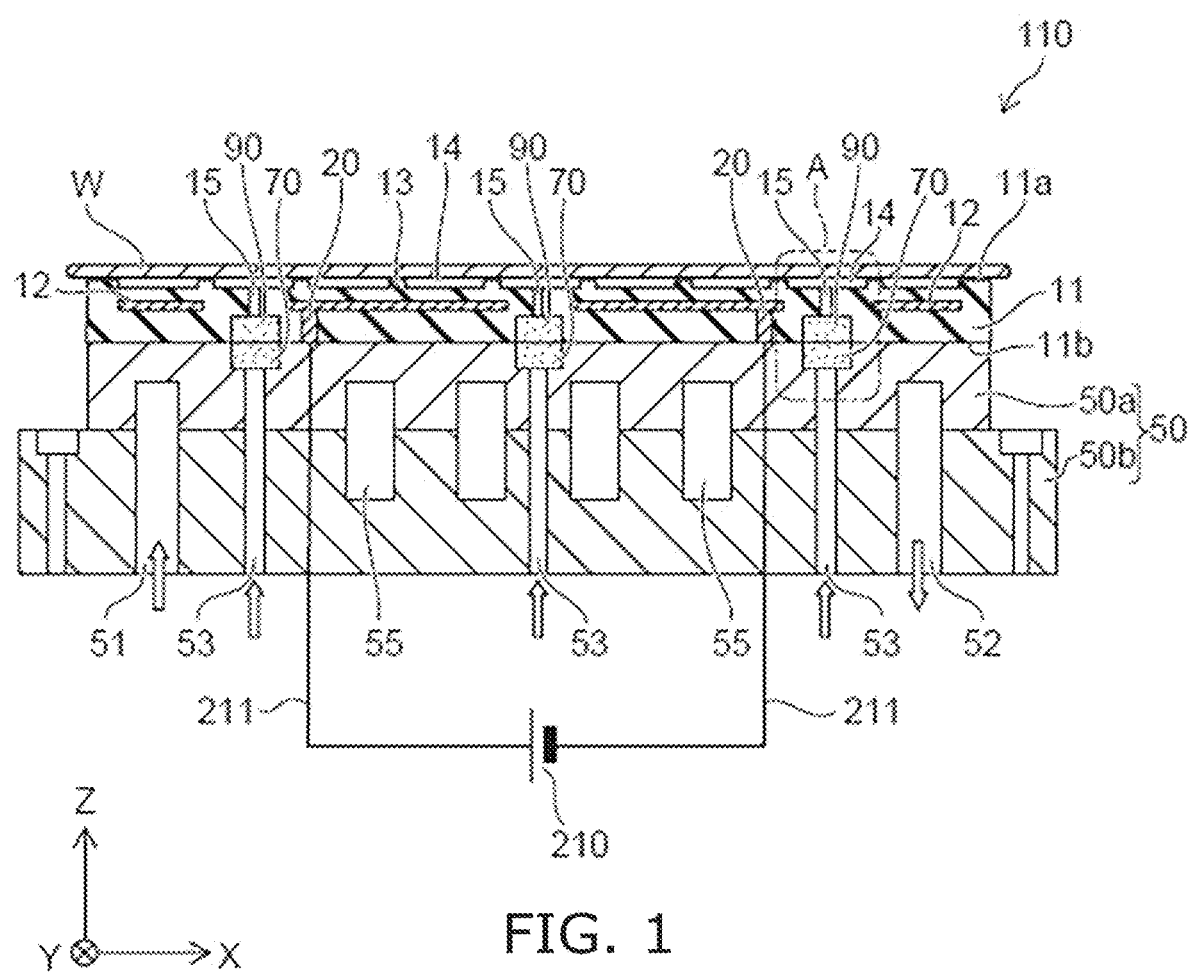
FIG. 1 is a schematic cross-sectional view illustrating an electrostatic chuck according to an embodiment.

A first invention is an electrostatic chuck including: a ceramic dielectric substrate including a first major surface on which an object of clamping is placed, and a second major surface at a side opposite to the first major surface; a base plate supporting the ceramic dielectric substrate and including an upper surface at the ceramic dielectric substrate side and a lower surface at a side opposite to the upper surface; a bonding part located between the ceramic dielectric substrate and the base plate; a gas inlet path extending through the ceramic dielectric substrate, the base plate, and the bonding part and including a first hole part positioned at the ceramic dielectric substrate, a second hole part positioned at the base plate, and a third hole part positioned at the bonding part; a counterbore part located in the first hole part; a ceramic porous part that is located in the counterbore part and includes a first surface at the third hole part side and a second surface at a side opposite to the first surface; and an elastic body facing an end part of the bonding part at the third hole part side, wherein the ceramic porous part further includes a side surface connecting the first surface and the second surface; the side surface includes a first side part at the first surface side, a second side part at the second surface side, and a third side part between the first side part and the second side part; a first direction is a direction from the base plate toward the ceramic dielectric substrate; a second direction is a direction substantially orthogonal to the first direction; a first sloped part is sloped with respect to the first direction and is provided in at least a region of the first side part contacting the first surface; the first surface overlaps the bonding part and the elastic body when viewed along the second direction; and the ceramic porous part is configured to contact the elastic body at the first sloped part.

There are cases where the ceramic dielectric substrate and/or the base plate expand or contract due to heat due to exposure of the electrostatic chuck to a large temperature change when in use. There are cases where the ceramic porous part located in the first hole part of the gas inlet path also may expand and deform toward the third hole part side at this time due to stress applied by the heat to the ceramic porous part. According to the electrostatic chuck, the elastic body is included; and the elastic body is configured to contact the first sloped part of the ceramic porous part provided in a region of the first side part at the first surface side contacting the first surface. Therefore, the deformation of the ceramic porous part can be absorbed by the first sloped part and the elastic body, thereby suppressing damage of the ceramic porous part. Therefore, the suppression effect of the arcing can be maintained for a long period of time. Because the elastic body is located in the third hole part to face the end part of the bonding part, the generation of particles due to the end part being corroded by the plasma when the electrostatic chuck is used can be suppressed. The arcing resistance can be increased because the first surface is configured to overlap the bonding part and the elastic body when viewed along the second direction.

A second invention is the electrostatic chuck of the first invention, wherein the ceramic porous part includes a gas-permeable porous portion and a dense portion that is denser than the porous portion, the dense portion covers an outer circumference of the porous portion, and the first sloped part is provided in the dense portion.

According to the electrostatic chuck, because the strength of the sloped part contacting the elastic body is further increased, damage of the ceramic porous part can be effectively suppressed, and the reduction effect of the arcing can be maintained for a long period of time.

A third invention is the electrostatic chuck of the first or second invention, wherein the first side part is made of the first sloped part.

According to the electrostatic chuck, damage of the ceramic porous part can be effectively suppressed, and the reduction effect of the arcing can be maintained for a long period of time.

A fourth invention is the electrostatic chuck of the third invention, wherein a second sloped part is provided in at least a part of the third side part and is continuous with the first sloped part, and a fixing part fixes the ceramic porous part to the counterbore part between the counterbore part and the second sloped part.

According to the electrostatic chuck, because the fixing part can be located at a position separated from the plasma, the corrosion of the fixing part due to the plasma can be suppressed, and the suppression effect of the arcing can be maintained for a long period of time.

A fifth invention is the electrostatic chuck of the fourth invention, wherein a length along the second direction of the second side part is substantially equal to a length along the second direction of the counterbore part.

According to the electrostatic chuck, the suppression effect of the arcing can be maintained for a long period of time because substantially no gap exists between the counterbore part and the second side part of the ceramic porous part most proximate to the plasma.

A sixth invention is the electrostatic chuck of the first or second invention, wherein a length along the first direction of a part of the elastic body contacting the first sloped part is greater than a length along the first direction of the bonding part.

According to the electrostatic chuck, the elastic body forms a physical barrier between the ceramic porous part and the end part of the bonding part; therefore, even when particles are generated by corrosion of the bonding part by the plasma, a decrease of the gas flow rate over time due to the particles penetrating the ceramic porous part can be suppressed. Therefore, the suppression effect of the arcing can be maintained for a long period of time.

A seventh invention is the electrostatic chuck of the first or second invention, wherein the elastic body is ring-shaped, and the first surface is surrounded with the elastic body when viewed along the first direction.

According to the electrostatic chuck, it is easy to position the elastic body; and the damage suppression effect of the ceramic porous part by the elastic body can be more reliably realized.

An eighth invention is the electrostatic chuck of the first or second invention, wherein the elastic body includes at least one of polytetrafluoroethylene or polyimide.

According to the electrostatic chuck, damage of the ceramic porous part can be effectively suppressed, and the suppression effect of the arcing can be maintained for a long period of time.

A ninth invention is a processing apparatus that includes any one of the electrostatic chucks described above, and a supply part configured to supply a gas to the gas inlet path of the electrostatic chuck. According to the processing apparatus, a reduction of the arcing can be realized.

A tenth invention is an electrostatic chuck including: a ceramic dielectric substrate including a first major surface on which an object of clamping is placed, and a second major surface at a side opposite to the first major surface; a base plate supporting the ceramic dielectric substrate and including an upper surface at the ceramic dielectric substrate side and a lower surface at a side opposite to the upper surface; a bonding part located between the ceramic dielectric substrate and the base plate; a gas inlet path extending through the ceramic dielectric substrate, the base plate, and the bonding part and including a first hole part positioned at the ceramic dielectric substrate, a second hole part positioned at the base plate, and a third hole part positioned at the bonding part; a counterbore part provided in the first hole part or the second hole part; a ceramic porous part that is located in the counterbore part and includes a first surface at the third hole part side and a second surface at a side opposite to the first surface; and an elastic body facing an end part of the bonding part at the third hole part side, wherein a first direction is a direction from the base plate toward the ceramic dielectric substrate; a second direction is a direction orthogonal to the first direction; the ceramic porous part includes a first ceramic part including the first surface, a second ceramic part including the second surface, and a third ceramic part positioned between the first ceramic part and the second ceramic part in the first direction; a length along the second direction of the first ceramic part is less than a length along the second direction of the third ceramic part; the first surface overlaps the bonding part and the elastic body when viewed along the second direction; at least a part of the elastic body overlaps the third ceramic part in the first direction; and the elastic body contacts at least one of the first ceramic part or the third ceramic part.

According to the electrostatic chuck, damage of the ceramic porous part can be suppressed by the elastic body absorbing the deformation of the ceramic porous part due to heat. Therefore, the suppression effect of the arcing can be maintained for a long period of time.

An eleventh invention is the electrostatic chuck of the tenth invention, wherein the ceramic porous part includes a side surface connecting the first surface and the second surface, the side surface includes a first side part at the first surface side, a second side part at the second surface side, and a third side part between the first side part and the second side part, a first sloped part is sloped with respect to the first direction and is provided in at least a region of the first side part contacting the first surface, and the ceramic porous part contacts the elastic body at the first sloped part.

According to the electrostatic chuck, damage of the ceramic porous part can be suppressed by the elastic body absorbing the deformation of the ceramic porous part due to heat.

A twelfth invention is the electrostatic chuck of the tenth invention, wherein the third ceramic part includes an extension surface extending along the second direction, and the elastic body contacts the extension surface.

According to the electrostatic chuck, damage of the ceramic porous part can be suppressed by the elastic body absorbing the deformation of the ceramic porous part due to heat.

A thirteenth invention is the electrostatic chuck of any one of the tenth to twelfth inventions, wherein the ceramic porous part includes a gas-permeable porous portion and a dense portion that is denser than the porous portion, the dense portion covers an outer circumference of the porous portion, and the elastic body contacts the dense portion.

According to the electrostatic chuck, because the strength of the part contacting the elastic body is further increased, damage of the ceramic porous part can be effectively suppressed, and the reduction effect of the arcing can be maintained for a long period of time.

A fourteenth invention is the electrostatic chuck of any one of the tenth to twelfth inventions, wherein a length along the second direction of the second ceramic part is substantially equal to a length along the second direction of the counterbore part.

According to the electrostatic chuck, the suppression effect of the arcing can be maintained for a long period of time because a gap between the ceramic porous part and the counterbore part can be suppressed.

A fifteenth invention is the electrostatic chuck of any one of the tenth to twelfth inventions, wherein the elastic body has compressive deformation in the first direction.

According to the electrostatic chuck, even when particles are generated from the bonding part, the particles can be prevented from reaching the ceramic porous part.

A sixteenth invention is the electrostatic chuck of any one of the tenth to twelfth inventions, wherein the elastic body is ring-shaped, and the first surface is surrounded with the elastic body when viewed along the first direction.

According to the electrostatic chuck, it is easy to position the elastic body; and the damage suppression effect of the ceramic porous part by the elastic body can be more reliably realized.

A seventeenth invention is the electrostatic chuck of any one of the tenth to twelfth inventions, wherein the elastic body includes at least one of polytetrafluoroethylene or polyimide.

According to the electrostatic chuck, damage of the ceramic porous part can be effectively suppressed, and the suppression effect of the arcing can be maintained for a long period of time.

An eighteenth invention is a processing apparatus that includes the electrostatic chuck of any one of the tenth to twelfth inventions, and a supply part configured to supply a gas to the gas inlet path of the electrostatic chuck.

According to the processing apparatus, a reduction of the arcing can be realized.

Exemplary embodiments will now be described with reference to the drawings. Similar components in the drawings are marked with the same reference numerals; and a detailed description is omitted as appropriate.

In each drawing, the direction from a base plate 50 toward a ceramic dielectric substrate 11 is taken as a Z-direction (corresponding to an example of a first direction); one direction substantially orthogonal to the Z-direction is taken as a Y-direction (corresponding to an example of a second direction); and a direction substantially orthogonal to the Z-direction and the Y-direction is taken as an X-direction (corresponding to an example of a second direction).

Electrostatic Chuck

FIG. 1 is a schematic cross-sectional view illustrating an electrostatic chuck according to an embodiment.

As shown in FIG. 1, the electrostatic chuck 110 according to the embodiment includes the ceramic dielectric substrate 11, the base plate 50, and a porous part 90. In the example, the electrostatic chuck 110 further includes a porous part 70.

The ceramic dielectric substrate 11 is, for example, a base material having a flat plate shape made of a sintered ceramic. For example, the ceramic dielectric substrate 11 includes aluminum oxide ($Al_2O_3$). For example, the ceramic dielectric substrate 11 is formed of high-purity aluminum oxide. The concentration of aluminum oxide in the ceramic dielectric substrate 11 is, for example, not less than 99 atomic percent (atomic %) and not more than 100 atomic %. By using high-purity aluminum oxide, the plasma resistance of the ceramic dielectric substrate 11 can be improved. The ceramic dielectric substrate 11 includes a first major surface 11a on which an object W (a clamping object) is placed, and a second major surface 11b at the side opposite to the first major surface 11a. The object W is, for example, a semiconductor substrate such as a silicon wafer, etc.

An electrode 12 is located in the ceramic dielectric substrate 11. The electrode 12 is located between the first major surface 11a and the second major surface 11b of the ceramic dielectric substrate 11. The electrode 12 is inserted into the ceramic dielectric substrate 11. A power supply 210 is electrically connected to the electrode 12 via a connection part 20 and wiring 211. By applying a clamping voltage to the electrode 12, the power supply 210 can generate a charge at the first major surface 11a side of the electrode 12 and clamp the object W by an electrostatic force.

The electrode 12 has a thin film shape along the first and second major surfaces 11a and 11b of the ceramic dielectric substrate 11. The electrode 12 is a clamping electrode for clamping the object W. The electrode 12 may be monopolar or bipolar. The electrode 12 illustrated in FIG. 1 is bipolar; and the two poles of the electrode 12 are located in the same plane. In addition to the electrode 12, a high-frequency application electrode and/or a heater electrode may be included in the ceramic dielectric substrate 11.

The connection part 20 that extends toward the second major surface 11b side of the ceramic dielectric substrate 11 is located at the electrode 12. The connection part 20 is, for example, a via (solid) or a via hole (hollow) that is electrically connected with the electrode 12. The connection part 20 may be a metal terminal connected by an appropriate method such as brazing, etc.

The base plate 50 is a member supporting the ceramic dielectric substrate 11. The base plate 50 includes an upper surface 50u at the ceramic dielectric substrate 11 side and a lower surface 50d at the side opposite to the upper surface 50u. The ceramic dielectric substrate 11 is fixed on the base plate 50 by a bonding part 60 illustrated in FIG. 2A. For example, the bonding part 60 can be a cured silicone adhesive. In the example, the upper surface 50u of the base plate 50 and the second major surface 11b of the ceramic dielectric substrate 11 are configured to contact the bonding part 60.

For example, the base plate 50 is made of metal. For example, the base plate 50 is divided into an upper part 50a and a lower part 50b made of aluminum; and a communicating path 55 is located between the upper part 50a and the lower part 50b. One end of the communicating path 55 is connected to an inlet path 51; and the other end of the communicating path 55 is connected to an outlet path 52. The base plate 50 may include a thermal spraying part (not illustrated) at the end part at the second major surface 11b side. For example, the thermal spraying part is formed by thermal spraying. The end surface (the upper surface 50u) of the base plate 50 at the second major surface 11b side may be formed of the thermal spraying part. The thermal spraying part is provided as necessary and is omissible.

The base plate 50 also performs the role of temperature regulation of the electrostatic chuck 110. For example, when cooling the electrostatic chuck 110, a cooling medium is caused to flow in through the inlet path 51, pass through the communicating path 55, and outflow from the outlet path 52. Thereby, the heat of the base plate 50 can be absorbed by the cooling medium; and the ceramic dielectric substrate 11 that is mounted on the base plate 50 can be cooled. On the other hand, when maintaining the temperature of the electrostatic chuck 110, it is also possible to introduce a heat-retaining medium into the communicating path 55. It is also possible to embed a heating element in the ceramic dielectric substrate 11 and/or the base plate 50. The temperature of the object W clamped by the electrostatic chuck 110 can be regulated by regulating the temperature of the base plate 50 and/or the ceramic dielectric substrate 11.

Dots 13 are provided as necessary at the first major surface 11a side of the ceramic dielectric substrate 11; and a groove 14 is provided between the dots 13. In other words, the first major surface 11a is an uneven surface and includes recesses and protrusions. The protrusions of the first major surface 11a correspond to the dots 13; and the recess of the first major surface 11a corresponds to the groove 14. For example, the groove 14 can extend continuously in the XY plane. Thereby, a gas such as He, etc., can be distributed to the entire first major surface 11a. A space is formed between the back surface of the object W placed on the electrostatic chuck 110 and the first major surface 11a that includes the groove 14.

The temperature of the object W and/or particles that are adhered to the object W can be controlled to be in a favorable state by appropriately selecting the height of the dots 13, the depth of the groove 14, the surface area ratio and shape of the dots 13 and the groove 14, etc.

A gas inlet path 53 extends through the ceramic dielectric substrate 11, the base plate 50, and the bonding part 60. The gas inlet path 53 includes a first hole part 53a positioned at the ceramic dielectric substrate 11, a second hole part 53b positioned at the base plate 50, and a third hole part 53c positioned at the bonding part 60. For example, the second hole part 53b extends through the base plate 50. The second hole part 53b may linearly extend through the base plate 50 or may be branched partway. The gas inlet path 53 may be provided in multiple locations of the base plate 50.

For example, the first hole part 53a is connected with the groove 14. The first hole part 53a is provided from the second major surface 11b to the first major surface 11a. In other words, the first hole part 53a extends in the Z-direction from the second major surface 11b to the first major surface 11a and extends through the ceramic dielectric substrate 11.

The second hole part 53b communicates with the first hole part 53a via the third hole part 53c. The gas (helium (He), etc.) that flows into the second hole part 53b passes through the second hole part 53b, then passes through the third hole part 53c, and then flows into the first hole part 53a.

The gas that flows into the first hole part 53a passes through the first hole part 53a and then flows into the space located between the object W and the first major surface 11a that includes the groove 14. Thereby, the object W can be directly cooled by the gas.

A counterbore part 53s is located in at least one of the first hole part 53a or the second hole part 53b. The porous part 90 and/or the porous part 70 is located in the counterbore part 53s.

The first hole part 53a includes a first part 53aa that includes the first major surface 11a, and a second part 53ab that includes the second major surface 11b. Another part may be included between the first part 53aa and the second part 53ab. For example, the counterbore part 53s is located in the second part 53ab.

The second hole part 53b includes a third part 53bu including the upper surface 50u and a fourth part 53bd including the lower surface 50d. Another part may be included between the third part 53bu and the fourth part 53bd. For example, the counterbore part 53s is located in the third part 53bu.

The porous part 90 and/or the porous part 70 is located in the counterbore part 53s. The porous part 90 includes a first surface 90a at the third hole part 53c side and a second surface 90b at the side opposite to the first surface 90a. The porous part 70 includes a third surface 70a at the third hole part 53c side and a fourth surface 70b at the side opposite to the third surface 70a. In the specification, the porous part is called the porous part 90 when located in the interior (the first hole part 53a) of the ceramic dielectric substrate 11 and is called the porous part 70 when located in the interior (the second hole part 53b) of the base plate 50.

In the gas inlet path 53, the cooling gas such as helium or the like flows in the order of the second hole part 53b, the third hole part 53c, and the first hole part 53a and is supplied to the first major surface 11a side of the ceramic dielectric substrate 11 via, for example, the groove 14. The plasma is positioned at the first major surface 11a side when the electrostatic chuck is used. Accordingly, when the ceramic porous part 90 is located in the first hole part 53a and the ceramic porous part 70 is located in the second hole part 53b, it is desirable for the ceramic porous part 90 that is located more proximate to the plasma to have a higher arcing resistance than the ceramic porous part 70. As an example, the pore size of a first porous portion 91 (details below) of the porous part 90 is set to be less than the pore size of a second porous portion 71 of the porous part 70; and the porosity of the first porous portion 91 is set to be less than the porosity of the second porous portion 71. Such a configuration is favorable from the perspective of the gas flow rate control because the gas permeability of the porous part 70 positioned at the upstream side of the gas flow can be greater than the gas permeability of the porous part 90 positioned at the downstream side of the gas flow. The porous part 70 may not be included.

Figure 2:
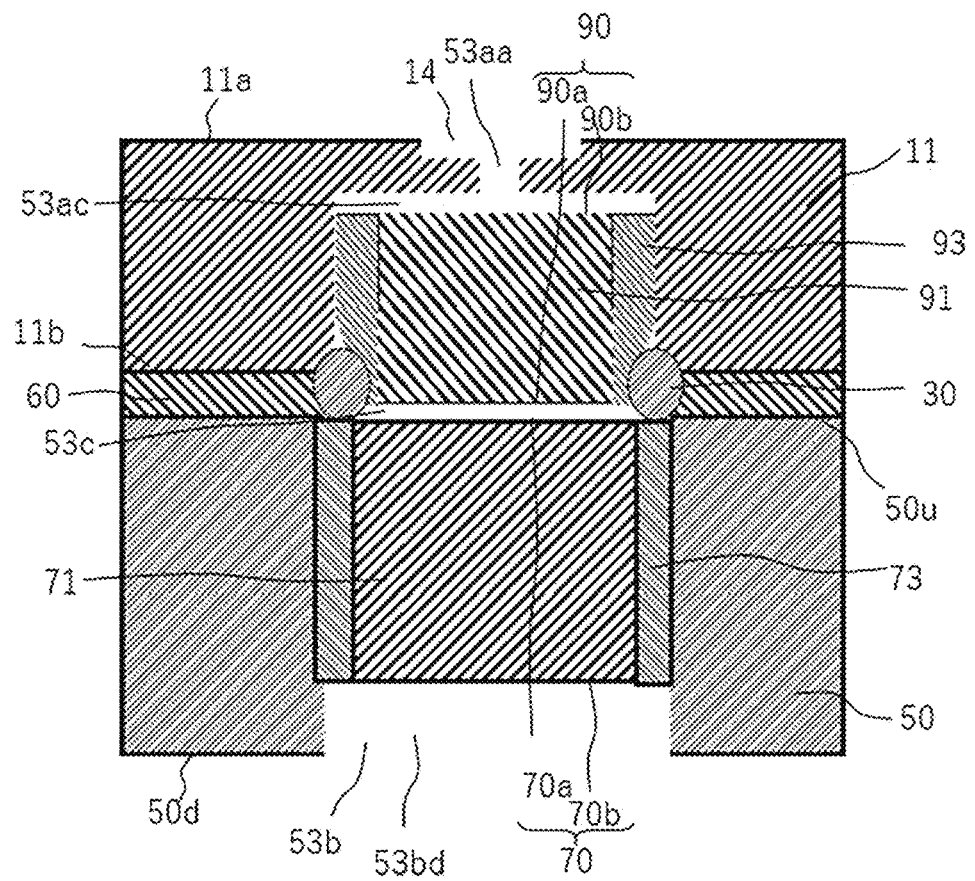
FIG. 2 is a schematic view illustrating the electrostatic chuck according to the embodiment.

FIG. 2 is a schematic view illustrating the electrostatic chuck according to the embodiment.

Figure 3:
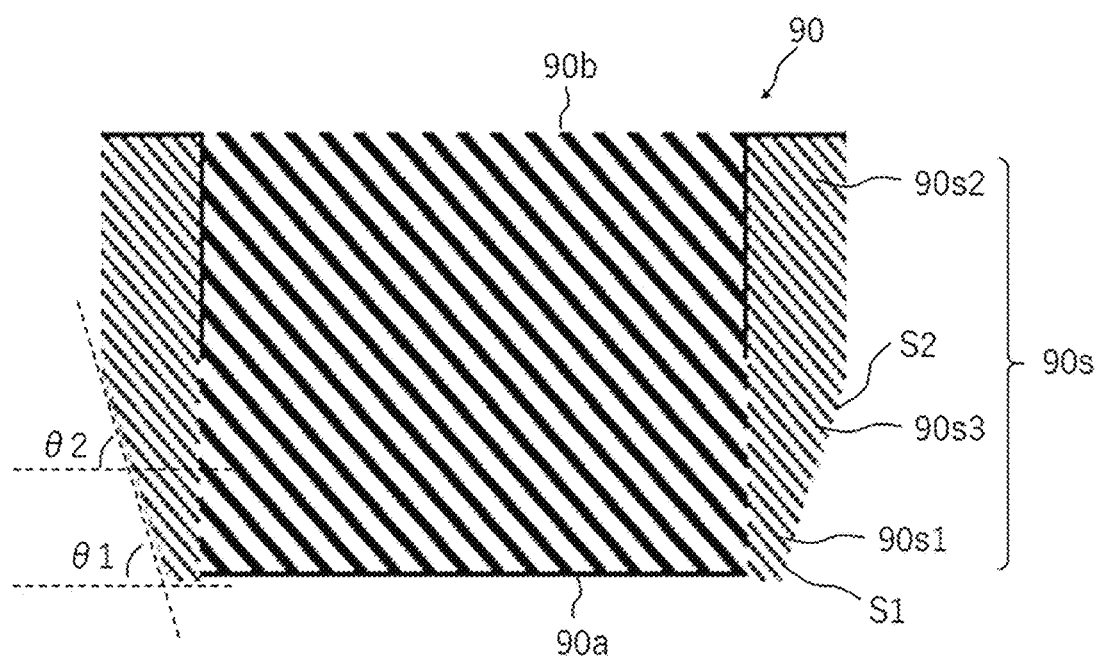
FIG. 3 is a schematic cross-sectional view illustrating the ceramic porous part according to the embodiment.

FIG. 3 is a schematic cross-sectional view illustrating the ceramic porous part according to the embodiment.

FIG. 2 is a schematic cross-sectional view illustrating the periphery of the porous parts 90 and 70, and corresponds to an enlarged view of region A shown in FIG. 1.

The dots 13 (e.g., see FIG. 1) are not illustrated in FIG. 2 to avoid complexity.

In the example as shown in FIG. 2, the porous part 90 is located in the counterbore part 53s located in the first hole part 53a; and the porous part 70 is located in the counterbore part 53s located in the second hole part 53b. The first surface 90a of the porous part 90 is an exposed surface exposed in the third hole part 53c. The first surface 90a and the second major surface 11b of the ceramic dielectric substrate 11 are substantially coplanar. The third surface 70a of the porous part 70 is an exposed surface exposed in the third hole part 53c. The third surface 70a and the upper surface 50u of the base plate 50 are substantially coplanar.

In the example, a length ts along the X or Y-direction of the counterbore part 53s located in the first hole part 53a is less than or equal to a length tc along the X or Y-direction of the third hole part 53c. A length t1 along the X or Y-direction of the porous part 90 is less than or equal to the length ts of the counterbore part. Therefore, the arcing suppression effect can be increased.

Electrical discharge between the counterbore part 53s and the side surface of the porous part 90 (the surface perpendicular to the first and second surfaces 90a and 90b) can be suppressed by setting the lateral width (the length t1) of the porous part 90 to be equal to the lateral width (the length ts) of the counterbore part 53s. For example, the length t1 and the length ts can be set to be equal by sintering the ceramic dielectric substrate 11 and the porous part 90 to have a continuous body. The fixation of the porous part 90 is described below.

As shown in FIG. 3, the porous part 90 includes a side surface 90s that connects the first surface 90a and the second surface 90b. The side surface 90s is the outer circumferential surface of the porous part 90. The side surface 90s is ring-shaped when the porous part 90 is circular columnar. The side surface 90s includes a first side part 90s1 at the first surface 90a side, a second side part 90s2 at the second surface 90b side, and a third side part 90s3 between the first side part 90s1 and the second side part 90s2. For example, the lower end of the first side part 90s1 is connected to the first surface 90a; and the first side part 90s1 contacts the first surface 90a. For example, the upper end of the second side part 90s2 is connected to the second surface 90b; and the second side part 90s2 contacts the second surface 90b. The first side part 90s1 includes a first sloped part S1 in a region that is positioned most proximate to the bonding part 60 and contacts the first surface 90a. The side surface 90s is sloped with respect to the Z-direction at the first sloped part S1. The length (the lateral width) when viewed along the X or Y-direction of the first surface 90a is less than the length when viewed along the X or Y-direction of the second surface 90b.

As shown in FIG. 2, the first surface 90a of the porous part 90 overlaps the bonding part 60 when viewed along the X or Y-direction. The first surface 90a is positioned at the third hole part 53c. The arcing resistance can be increased because the insulative ceramic porous part 90 is located in the third hole part 53c (the space).

The electrostatic chuck 110 includes an elastic body 30. The elastic body 30 faces an end part 60e of the bonding part 60. Although the elastic body 30 and the bonding part 60 contact in the X or Y-direction in the example shown in FIG. 2, the elastic body 30 and the bonding part 60 may be separated from each other. The first surface 90a also overlaps the elastic body 30 described below when viewed along the X or Y-direction.

The elastic body 30 is sandwiched between the ceramic porous part 90 and the base plate 50 in the Z-direction. In the example, the porous part 70 is located in the second hole part 53b of the base plate 50; and the elastic body 30 is sandwiched between the ceramic porous part 90 and the porous part 70 in the Z-direction. In such a case, the elastic body 30 contacts the porous part 90 at the first sloped part S1.

There are cases where the electrostatic chuck is exposed to a large temperature change when in use, and the ceramic dielectric substrate 11 and/or the base plate 50 may expand or contract due to the heat. At this time, stress due to heat also may be applied to the ceramic porous part 90 located in the first hole part 53a of the gas inlet path, thereby causing the porous part 90 to expand and deform toward the third hole part 53c side. According to the electrostatic chuck 110, the elastic body 30 is included; and the elastic body 30 is configured to contact the first sloped part S1 located in the region of the first side part 90s1 at the first surface 90a side of the ceramic porous part 90 contacting the first surface 90a. Therefore, damage of the ceramic porous part 90 can be suppressed by the deformation of the ceramic porous part 90 being absorbed by the first sloped part S1 and the elastic body 30. Therefore, the suppression effect of the arcing can be maintained for a long period of time. Because the elastic body 30 is located in the third hole part 53c to face the end part 60e of the bonding part 60, the generation of particles due to the end part 60e being corroded by the plasma when the electrostatic chuck is used can be suppressed.

The elastic body 30 includes a material that is insulative and plasma-resistant. For example, the elastic body 30 has sufficient elasticity (flexibility) to absorb the displacement of the porous part 90. The elastic body includes a resin. A fluorocarbon resin such as polytetrafluoroethylene (PTFE) or the like, polyimide, etc., are examples of the resin. When ring-shaped, the elastic body is easier to position and favorable from a manufacturing standpoint.

As shown in FIG. 3, the porous part 90 includes a porous portion (the first porous portion 91) and a dense portion (a first dense portion 93). The first porous portion 91 is gas-permeable. The first dense portion 93 is more dense than the first porous portion 91. The porosity of the first porous portion 91 is greater than the porosity of the first dense portion 93. The first porous portion 91 has multiple pores. It is favorable for the multiple pores to be linear pores with a prescribed range of pore sizes. In such a case, the pore size is, for example, 1 μm to 30 μm. The multiple pores may be randomly arranged while communicating with each other. The first dense portion 93 may be substantially gas-impermeable. The first dense portion 93 covers the outer circumference of the first porous portion 91. The rigidity of the porous part 90 can be increased by including the first dense portion 93. For example, when an adhesive is located between the counterbore part 53s and the side surface 90s of the porous part 90, the degradation of the gas permeability of the porous part 90 due to penetration of the adhesive can be suppressed by providing the first dense portion 93.

The first sloped part S1 is located in the dense portion (the first dense portion 93) in the side surface 90s. Therefore, the strength of the first sloped part S1 contacting the elastic body 30 can be further increased, damage of the ceramic porous part 90 can be effectively suppressed, and the reduction effect of the arcing can be maintained for a long period of time. In the example, the length along the Z-direction of the part of the elastic body 30 contacting the first sloped part is greater than the length along the Z-direction of the bonding part 60. Therefore, because the elastic body 30 acts as a physical barrier between the ceramic porous part 90 and the end part 60e of the bonding part 60, even when particles are generated by the bonding part 60 being corroded by the plasma, a decrease of the gas flow rate over time due to the particles penetrating the ceramic porous part 90 can be suppressed. Therefore, the suppression effect of the arcing can be maintained for a long period of time.

From the perspective of the damage suppression of the ceramic porous part, it is also favorable for the first side part 90s1 to be made of the first sloped part S1, that is, for the entire first side part 90s1 to include the first sloped part S1.

It is also favorable for the length along the X or Y-direction of the elastic body 30 to be less than the length along the X or Y-direction of the first dense portion 93 located at the outer circumference of the first porous portion 91. In such a case, damage of the porous part 90 can be effectively suppressed. Also, the decrease of the gas flow rate of the porous part 90 can be suppressed because the elastic body 30 overlaps the first porous portion 91 when viewed along the Z-direction.

When the elastic body 30 is ring-shaped, the length along the X or Y-direction refers to the width of the ring (the annulus). The length along the X or Y-direction of the first dense portion 93 refers to the width of the ring shape (the annulus) covering the first porous portion 91.

Similarly, in the example shown in FIG. 2, the porous part 70 includes the second porous portion 71 and a second dense portion 73. The second porous portion 71 is gas-permeable. The second dense portion 73 is more dense than the second porous portion 71. The porosity of the second porous portion 71 is greater than the porosity of the second dense portion 73. The second dense portion 73 may be substantially gas-impermeable. The second dense portion 73 covers the outer circumference of the second porous portion 71. When the multiple pores in the second porous portion 71 are linear pores with a prescribed range of pore sizes, the pore size may be greater than that of the first porous portion 91. When the electrostatic chuck 110 includes the porous part 70 located in the second hole part 53b, the elastic body 30 contacts the third surface 70a of the porous part 70. When the porous part 70 includes the second porous portion 71 and the second dense portion 73, it is favorable for the elastic body 30 to contact the second dense portion 73. The elastic body 30 may contact a part of the second porous portion 71.

In addition to the part covering the outer circumference of the first dense portion 93, the porous part 90 may include another part as the first porous portion 91. Examples of the other part include a first central dense portion that overlaps the first part 53aa of the first hole part 53a when viewed along the Z-direction at the center vicinity of the first dense portion 93. In the porous part 70 as well, in addition to the part of the second dense portion 73 covering the outer circumference, the porous part 70 may include another part as the second porous portion 71. Examples of the other part include a second central dense portion, i.e., a part that overlaps the first part 53aa of the first hole part 53a when viewed along the Z-direction and is a part of the first dense portion 93 surrounding the part located at the center vicinity when viewed along the Z-direction.

For details of the first central dense portion and the second central dense portion, the content of JP-A 2020-072261 (Kokai) and JP-A 2020-150257 (Kokai) is hereby incorporated herein by reference as a part of the specification.

For example, the density of the first porous portion 91 is less than the density of the first dense portion 93. For example, the gas permeability of the first porous portion 91 is greater than the gas permeability of the first dense portion 93. For example, the first porous portion 91 is cylindrical. The first dense portion 93 contacts the outer circumference side surface of the first porous portion 91. The first dense portion 93 has a ring shape (a tube shape) surrounding the outer circumference side surface of the first porous portion 91.

For example, the density of the second porous portion 71 is less than the density of the second dense portion 73. For example, the gas permeability of the second porous portion 71 is greater than the gas permeability of the second dense portion 73. For example, the second porous portion 71 is cylindrical. The second dense portion 73 contacts the outer circumference side surface of the second porous portion 71.

The second dense portion 73 has a ring shape (a tube shape) surrounding the outer circumference side surface of the second porous portion 71.

Figure 4:
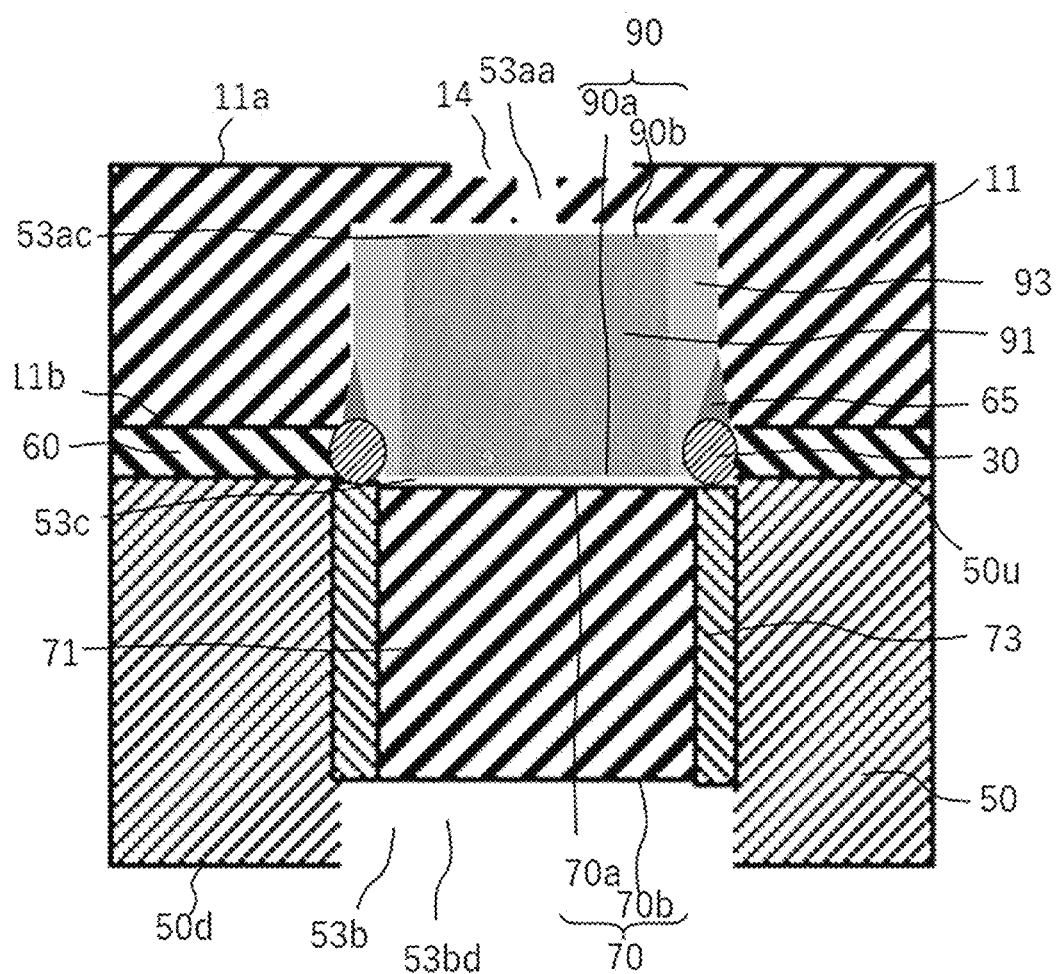
FIG. 4 is a schematic view illustrating an electrostatic chuck according to another embodiment.

FIG. 4 is a schematic view illustrating an electrostatic chuck according to another embodiment.

In the example shown in FIG. 4, at least a part of the third side part 90s3 of the porous part 90 includes a second sloped part S2. In the example, the first side part 90s1 is made of the first sloped part S1; and the second sloped part S2 is continuous with the first sloped part S1.

That is, the first sloped part S1 and the second sloped part S2 are provided continuously from the first surface 90a side of the porous part 90. A fixing part 65 is located between the second sloped part S2 and the counterbore part 53s. Therefore, corrosion of the fixing part 65 due to the plasma can be suppressed because the fixing part 65 can be located at a position separated from the plasma; and the suppression effect of the arcing can be maintained for a long period of time.

The fixing part 65 can be similar to the bonding part 60 and can be, for example, a cured silicone adhesive. In the example, an angle θ1 of the first sloped part S1 with respect to the first surface 90a and an angle θ2 of the second sloped part S2 with respect to the first surface 90a are equal. When the angle θ1 is greater than the angle θ2, the space between the second sloped part S2 and the counterbore part 53s is smaller, and the space between the first sloped part S1 and the counterbore part 53s or the bonding part 60 is larger. Therefore, damage of the porous part 90 can be effectively suppressed while increasing the arcing resistance. When the angle θ1 is less than the angle θ2, the space between the second sloped part S2 and the counterbore part 53s is larger. Therefore, the porous part 90 can be more securely fixed by the fixing part 65. θ1 and θ2 are, for example, 15° to 50°. As an example, the maximum distance in the Z-direction from the first surface 90a of the first sloped part S1 is not more than 30% of the distance in the Z-direction (the height) of the porous part 90. As an example, the maximum distance in the Z-direction of the second sloped part S2 from the first surface 90a is not more than 60% of the distance in the Z-direction (the height) of the porous part 90.

As shown in FIG. 4, the length along the X or Y-direction of the second side part 90s2 of the porous part 90 may be substantially equal to the length along the X or Y-direction of the counterbore part 53s. That is, there may be substantially no gap along the X or Y-direction between the second side part 90s2 and the counterbore part 53s. Therefore, the arcing resistance can be increased. It is also favorable that the fixing part is not between the second side part 90s2 and the counterbore part 53s. In such a case, the decrease of the arcing resistance of the fixing part over time during use due to erosion by the plasma can be suppressed.

An insulative arcing suppressor part (not illustrated) may be provided in the third hole part 53c. The arcing resistance can be increased by substantially filling the space of the third hole part 53c with the arcing suppressor part. The arcing suppressor part is configured to allow a gas to pass. The arcing suppressor part may be elastic. The arcing suppressor part may include a fluorocarbon resin such as polyimide, polytetrafluoroethylene (PTFE), or the like, an epoxy resin, etc. The arcing suppressor part may include a ceramic. It is favorable for the arcing suppressor part to have a higher gas permeability than the porous part 90.

The porosity of the porous part 90 may be less than the porosity of the porous part 70. The arcing resistance can be further increased by setting the porosity of the porous part 90 located in the part of the gas inlet path 53 more proximate to the plasma atmosphere to be relatively small.

Although the electrostatic chuck of the example of FIGS. 2 and 3 includes two porous parts (the porous part 90 and the porous part 70), the porous part is not limited thereto and is modifiable according to the object; only the porous part 90 may be used.

As an example, the lateral width (ts) of the counterbore part 53s is 1 mm to 5 mm. A length t1a along the X or Y-direction of the first part 53aa in the first hole part 53a is, for example, not less than 0.05 millimeters (mm) and not more than 0.5 mm.

When the first part 53aa of the first hole part 53a opens into the groove 14, the lateral width (t1a) of the first part 53aa is the width of the part of the first part 53aa contacting the groove. The lateral width (t1) of the porous part 90 and the lateral width (a length t2) of the porous part 70 each are the dimensions of the largest parts. It is favorable for not less than 50% of the porous part, favorably not less than 70% of the porous part, and more favorably not less than 90% of the porous part to have this dimension.

The height (a length h2) of the bonding part 60 is, for example, 100 μm to 1000 μm, and favorably 200 μm to 600 μm. The length along the Z-direction of the bonding part 60 is equal to the length along the Z-direction of the third hole part 53c.

In the example, the second surface 90b of the porous part 90 is positioned inside the first hole part 53a. That is, the second surface 90b and the first major surface 11a of the ceramic dielectric substrate 11 are not in the same plane. The fourth surface 70b of the porous part 70 is positioned inside the second hole part 53b. That is, the fourth surface 70b and the lower surface 50d of the base plate 50 are not in the same plane.

The materials of the porous parts 90 and 70 include insulative ceramics. The porous part 90 (the first porous portion 91 and the first dense portion 93 described below) include at least one of aluminum oxide ($Al_2O_3$), titanium oxide ($TiO_2$), or yttrium oxide ($Y_2O_3$). High breakdown voltage and high rigidity of the porous part 90 can be obtained thereby.

For example, the porous part 90 includes one of aluminum oxide, titanium oxide, or yttrium oxide as a major component.

In such a case, the purity of the aluminum oxide of the ceramic dielectric substrate 11 can be set to be greater than the purity of the aluminum oxide of the porous part 90. Thus, the performance of the electrostatic chuck 110 such as the plasma resistance, etc., can be ensured, and the mechanical strength of the porous part 90 can be ensured. As an example, it is possible to control the porosity and ensure the mechanical strength by promoting sintering of the porous part 90 by adding a trace additive to the porous part 90.

For details of the porous parts 90 and 70, the content of JP 6489277 is hereby incorporated herein by reference as a part of the specification.

In the specification, the ceramic purity of the aluminum oxide of the ceramic dielectric substrate 11, etc., can be measured by fluorescent X-ray analysis, ICP-AES (Inductively Coupled Plasma-Atomic Emission Spectrometry (high-frequency inductively coupled plasma optical emission spectrometry)), etc.

In the porous part, for example, the materials of the porous portions (the first porous portion 91 and the second porous portion 71) and the materials of the dense portions (the first dense portion 93 and the second dense portion 73) are the same. However, the materials of the porous portions may be different from the materials of the dense portions. The compositions of the materials of the porous portions may be different from the compositions of the materials of the dense portions.

For example, the porosities of the ceramic dielectric substrate 11 and the porous part 70 are calculated by performing image analysis of an image obtained by a scanning electron microscope. The density is measured based on JIS C 21415.4.3.

Manufacturing Method

A method for manufacturing the electrostatic chuck according to the embodiment described above will now be described.

The ceramic dielectric substrate 11 in which the porous part 90 is located in the first hole part 53a is prepared; and the base plate 50 in which the porous part 70 is located in the second hole part 53b is prepared. The side surface 90s of the porous part 90 includes the first sloped part S1. An adhesive that is used as the bonding part 60 is located at the second major surface 11b of the ceramic dielectric substrate 11 or the upper surface 50u of the base plate 50. The elastic body 30 is located at a prescribed position of the base plate 50 or the ceramic dielectric substrate 11. The bonding part 60 is formed by bonding the base plate 50 and the ceramic dielectric substrate 11 so that the first hole part 53a and the second hole part 53b face each other with the first sloped part S1 and the elastic body 30 in contact.

Processing Apparatus

Figure 5:
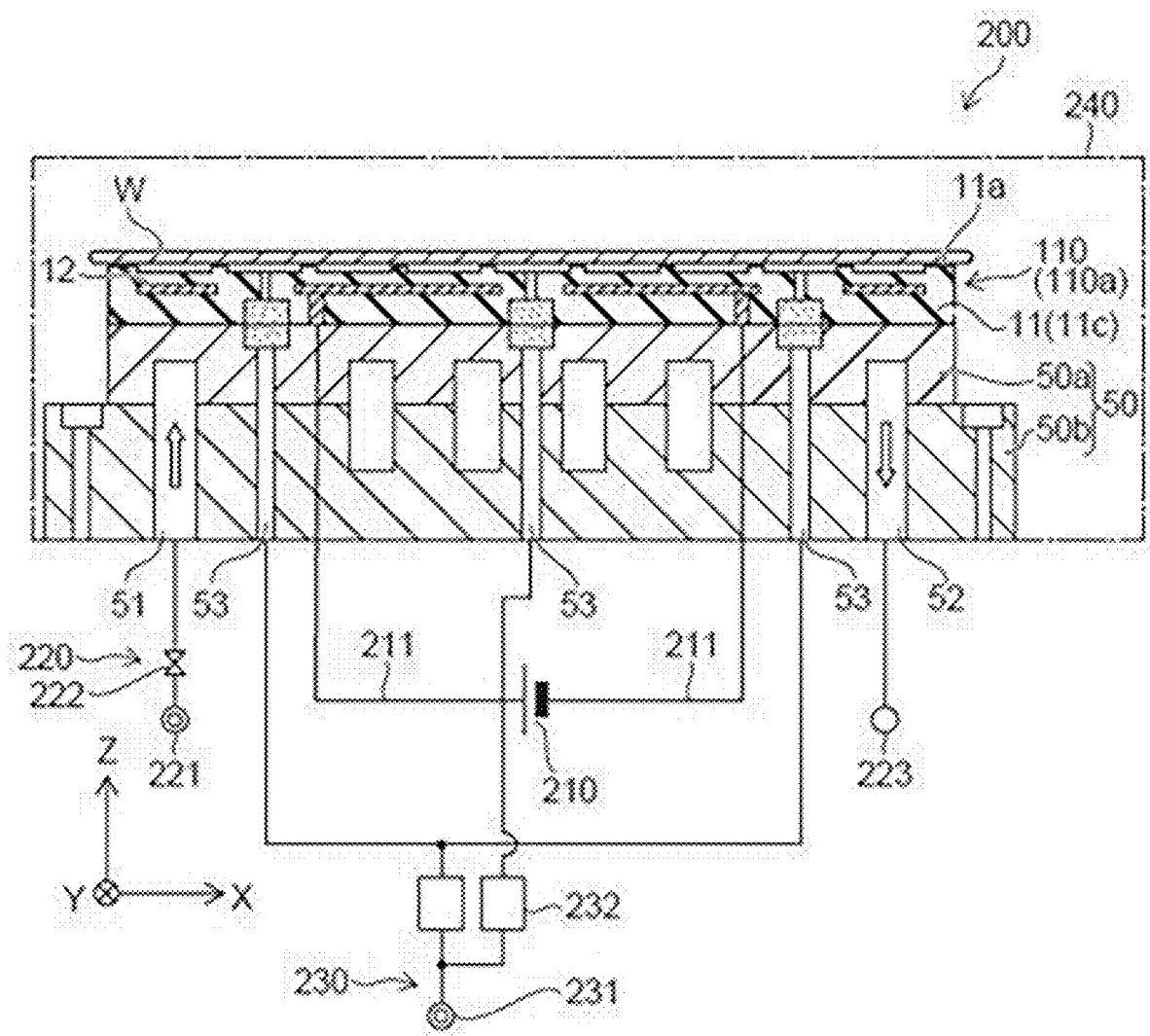
FIG. 5 is a schematic view illustrating a processing apparatus according to the embodiment.

FIG. 5 is a schematic view illustrating a processing apparatus 200 according to the embodiment.

As shown in FIG. 5, the processing apparatus 200 can include the electrostatic chuck 110, the power supply 210, a medium supply part 220, and a supply part 230.

The power supply 210 is electrically connected with the electrode 12 located in the electrostatic chuck 110. The power supply 210 can be, for example, a DC power supply. The power supply 210 applies a prescribed voltage to the electrode 12. A switch that switches between the application of the voltage and the cutoff of the application of the voltage also can be included in the power supply 210.

The medium supply part 220 is connected to the inlet path 51 and the outlet path 52. For example, the medium supply part 220 can supply a liquid used as a cooling medium or a heat-retaining medium.

The medium supply part 220 includes, for example, a storage part 221, a control valve 222, and a discharge part 223.

The storage part 221 can be, for example, a tank, factory piping, etc., storing a liquid. A cooling device and/or a heating device that controls the temperature of the liquid can be included in the storage part 221. A pump for supplying the liquid, etc., also can be included in the storage part 221.

The control valve 222 is connected between the inlet path 51 and the storage part 221. The control valve 222 can control at least one of the flow rate or the pressure of the liquid. The control valve 222 also may be able to switch between the supply of the liquid and the cutoff of the supply.

The discharge part 223 is connected to the outlet path 52. The discharge part 223 can be a tank, drain pipe, or the like that recovers the liquid discharged from the outlet path 52. The discharge part 223 is not always necessary; the liquid that is discharged from the outlet path 52 may be supplied to the storage part 221. Thus, resource conservation can be realized by circulating the cooling medium or the heat-retaining medium.

The supply part 230 includes a gas supply part 231 and a gas controller 232.

The gas supply part 231 can be a high-pressure cylinder, factory piping, or the like that stores a gas such as helium, etc. Although a case is illustrated where one gas supply part 231 is provided, multiple gas supply parts 231 may be provided.

The gas controller 232 is connected between the gas supply part 231 and multiple gas inlet paths 53. The gas controller 232 can control at least one of the flow rate or the pressure of the gas. The gas controller 232 also can have the function of switching between the supply of the gas and the cutoff of the supply. For example, the gas controller 232 can be a mass flow controller, a mass flow meter, etc.

As shown in FIG. 5, multiple gas controllers 232 can be provided. For example, the gas controllers 232 can be located in multiple regions of the first major surface 11a. Thus, the control of the supplied gas can be performed for each of the multiple regions. In such a case, the gas controllers 232 can be provided respectively for the multiple gas inlet paths 53. Thus, the control of the gas in the multiple regions can be more accurately performed. Although a case is illustrated where multiple gas controllers 232 are provided, one gas controller 232 may be used as long as the supply of the gas is independently controllable for the multiple supply systems.

Here, a vacuum chuck, mechanical chuck, or the like is used to hold the object W. However, a vacuum chuck cannot be used in an environment depressurized from atmospheric pressure. When a mechanical chuck is used, there is a risk that the object W may be damaged and/or particles may be generated. Therefore, for example, an electrostatic chuck is used in a processing apparatus used in semiconductor manufacturing processes, etc.

It is necessary to isolate the processing space of such a processing apparatus from the external environment. Therefore, the processing apparatus 200 can further include a chamber 240. For example, the chamber 240 can have an airtight structure that can maintain an atmosphere depressurized from atmospheric pressure.

The processing apparatus 200 also can include multiple lift pins and a drive device that raises and lowers the multiple lift pins. When the object W is received from a transfer apparatus and when the object W is transferred to the transfer apparatus, the lift pins are raised by the drive device and protrude from the first major surface 11a. When the object W received from the transfer apparatus is placed on the first major surface 11a, the lift pins are lowered by the drive device and stored inside the ceramic dielectric substrate 11.

Various devices can be included in the processing apparatus 200 according to the content of the processing. For example, a vacuum pump that exhausts the interior of the chamber 240, etc., can be provided. A plasma generator that generates plasma inside the chamber 240 can be provided. A process gas supply part that supplies a process gas to the interior of the chamber 240 can be provided. A heater that heats the object W and/or the process gas also can be provided inside the chamber 240. The devices that are included in the processing apparatus 200 are not limited to those illustrated. Known technology is applicable to the devices included in the processing apparatus 200; and a detailed description is therefore omitted.

Figure 6:
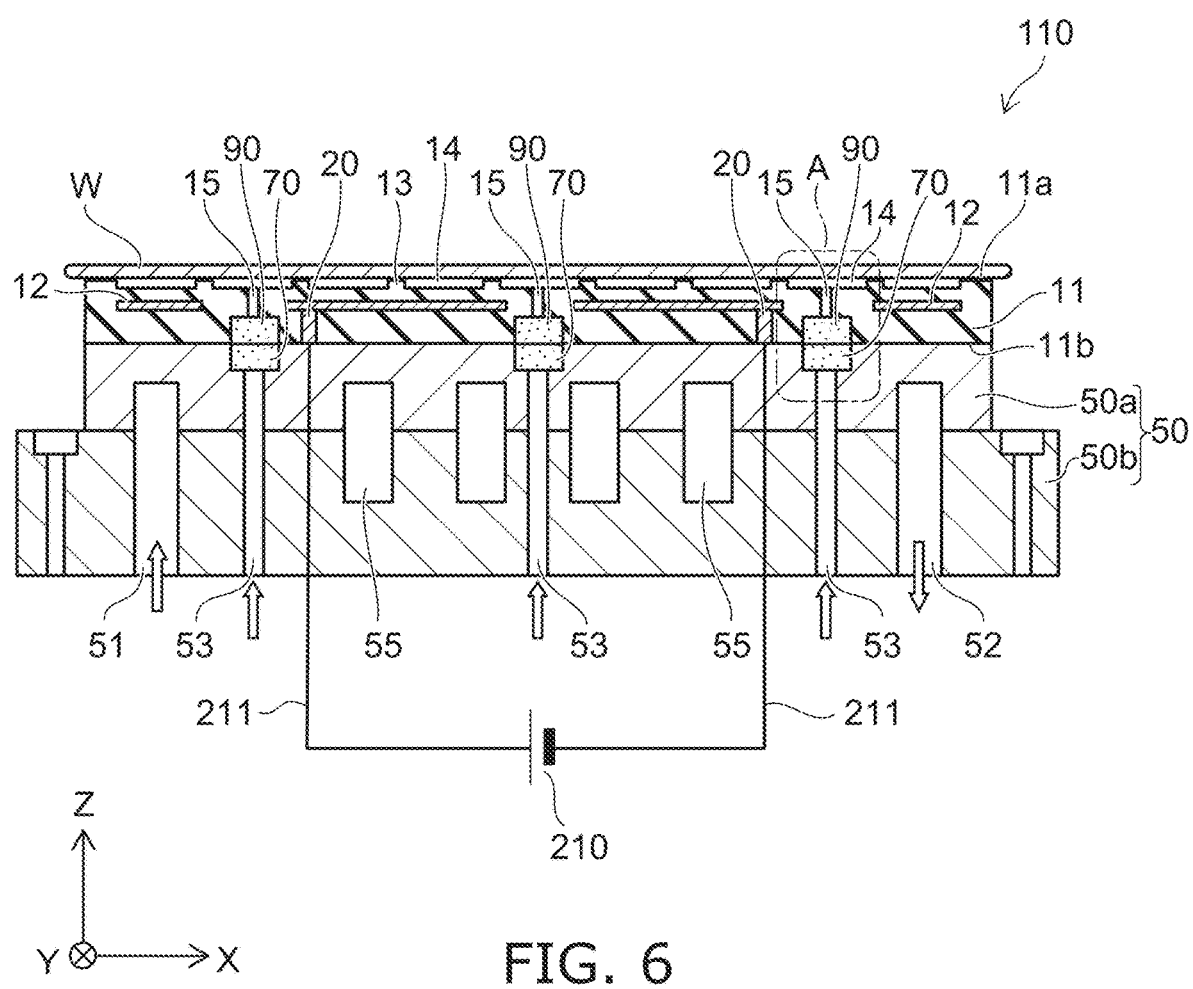
FIG. 6 is a schematic cross-sectional view illustrating the electrostatic chuck according to the embodiment.

FIG. 6 is a schematic cross-sectional view illustrating the electrostatic chuck according to the embodiment.

Figure 7:
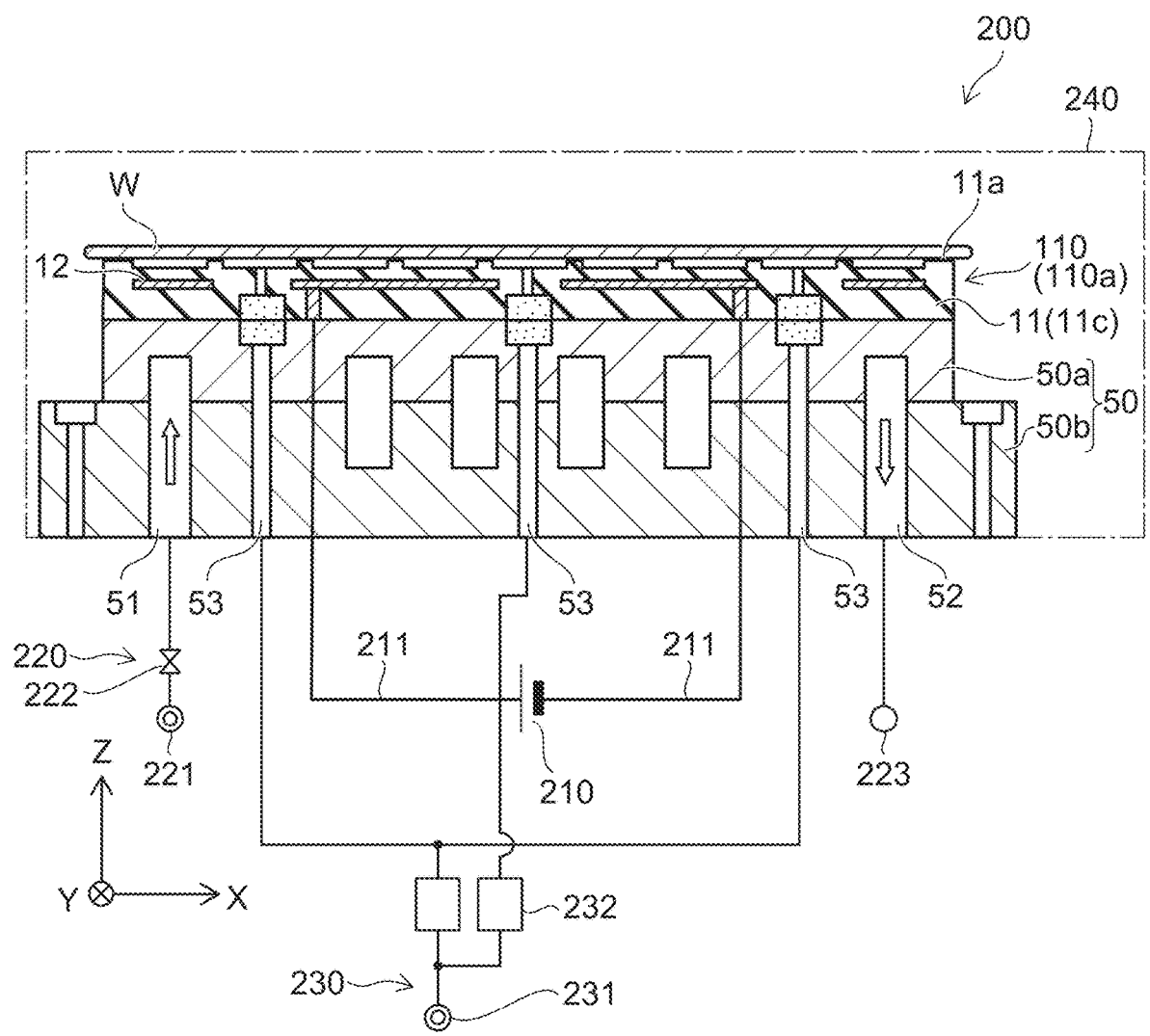
FIG. 7 is a schematic view illustrating the processing apparatus according to the embodiment.

FIG. 7 is a schematic view illustrating the processing apparatus according to the embodiment.

FIG. 6 corresponds to the electrostatic chuck shown in FIG. 1. FIG. 7 corresponds to the processing apparatus shown in FIG. 5.

An electrostatic chuck 110*a* (an example of the electrostatic chuck 110) and a ceramic dielectric substrate 11*c* (an example of the ceramic dielectric substrate 11) are included in the example as illustrated in FIG. 7.

Figure 8:
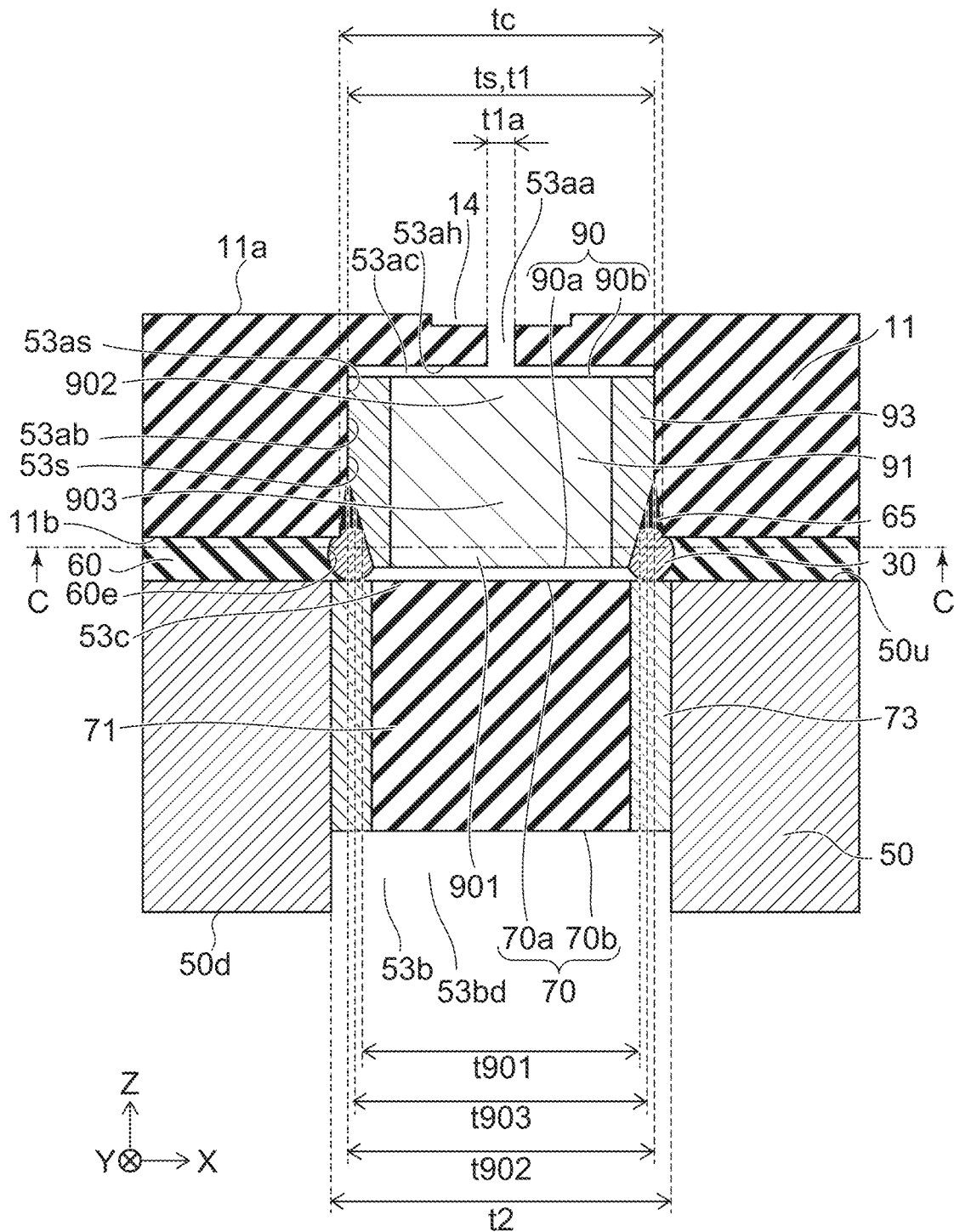
FIG. 8 is a schematic cross-sectional view illustrating the electrostatic chuck according to the embodiment.

FIG. 8 is a schematic cross-sectional view illustrating the electrostatic chuck according to the embodiment.

FIG. 8 is a schematic cross-sectional view illustrating the periphery of the porous parts 90 and 70, and corresponds to FIG. 4. In the description of the embodiment, a direction from the base plate 50 toward the ceramic dielectric substrate 11 may be called "up", and the direction from the ceramic dielectric substrate 11 toward the base plate 50 may be called "down". The ceramic porous part 90 may be called the porous part 90; and the ceramic porous part 70 may be called the porous part 70.

The first hole part 53*a* is arranged with the ceramic dielectric substrate 11 in the second direction (one direction in the XY plane). The XY plane is perpendicular to the Z-direction. For example, the first hole part 53*a* is formed of at least a part of a hole provided in the ceramic dielectric substrate 11. The second hole part 53*b* is arranged with the base plate 50 in the second direction. For example, the second hole part 53*b* is formed of at least a part of a hole provided in the base plate 50. The third hole part 53*c* extends through the bonding part 60 and is arranged with the bonding part 60 in the second direction. For example, the third hole part 53*c* is formed of at least a part of a space (a hole) surrounded with the bonding part 60.

For example, the shapes in the XY plane of the outer circumferences of the first hole part 53*a*, the second hole part 53*b*, and the third hole part 53*c* are circular. Included in the scope of circular are not only perfectly round circles (perfect circles) but also distorted shapes of perfect circles, e.g., ellipses and flattened circles. Cylindrical is columnar with a circular cross-sectional shape.

The first hole part 53*a* includes the first part 53*aa*, the second part 53*ab*, and a middle part 53*ac*. The middle part 53*ac* is positioned between the first part 53*aa* and the second part 53*ab*. For example, the middle part 53*ac* includes a space between the second surface 90*b* of the porous part 90 and the ceramic dielectric substrate 11 (a counterbore surface 53*ah*).

The second part 53*ab* includes the counterbore part 53*s*. For example, the shapes in the XY plane of the outer circumferences of the first part 53*aa*, the second part 53*ab*, the middle part 53*ac*, and the counterbore part 53*s* are circular. The length ts along the second direction of the counterbore part 53*s* is greater than the length t1*a* along the second direction of the first part 53*aa*. The length ts is, for example, the diameter of the counterbore part 53*s* and is the maximum width of the planar shape of the counterbore part 53*s*. The maximum width of the planar shape is the maximum value among the lengths along directions in the XY plane. The length t1*a* is, for example, the diameter of the first part 53*aa* and is the maximum width of the planar shape of the first part 53*aa*. For example, the counterbore part 53*s* is at least a portion of the part of the first hole part 53*a* having a greater diameter than the first part 53*aa*. For example, in the XY plane, the position of the center of the counterbore part 53*s* is substantially the same as the position of the center of the first part 53*aa*.

For example, the length ts along the second direction of the counterbore part 53*s* is not more than the length tc along the second direction of the third hole part 53*c*. The length tc is, for example, the diameter of the third hole part 53*c* and is the maximum width of the planar shape of the third hole part 53*c*.

For example, the length t1 along the second direction of the porous part 90 is not more than the length ts of the counterbore part 53*s*. The length t1 is, for example, the diameter of the porous part 90 and is the maximum width of the planar shape of the porous part 90.

The upper end of the first part 53*aa* is located in the first major surface 11*a* of the ceramic dielectric substrate 11 and continuous with the groove 14 of the first major surface 11*a*. The first part 53*aa* is directly connected to the groove 14 of the first major surface 11*a*. The lower end of the second part 53*ab* is located in the second major surface 11*b* of the ceramic dielectric substrate 11. The lower end of the counterbore part 53*s* is located in the second major surface 11*b* of the ceramic dielectric substrate 11.

The ceramic dielectric substrate 11 includes a counterbore surface 53*ah* crossing an inner circumference side surface 53*as* of the first hole part 53*a*. For example, the counterbore surface 53*ah* extends in the second direction and faces downward. The lower end of the first part 53*aa* is located in the counterbore surface 53*ah*.

The first surface 90*a* of the porous part 90 is the lower surface at the base plate 50 side; and the second surface 90*b* is the upper surface. For example, the first surface 90*a* and the second surface 90*b* each extend along the XY plane and are substantially planes. A space is formed between the first surface 90*a* and the porous part 70 (or the base plate 50).

The elastic body 30 is arranged with the bonding part 60 and the first surface 90*a* in the second direction. The elastic body 30 is positioned between the first surface 90*a* and the end part of the bonding part 60. For example, the elastic body 30 isolates the bonding part 60 from the space between the first surface 90*a* and the porous part 70 (or the base plate 50). The bonding part 60 is protected thereby, and exposure to plasma and/or gas is suppressed. For example, the elastic body 30 is located so that the bonding part 60 does not directly contact the space of the gas inlet path 53 through which the gas can pass.

The porous part 90 may include a first ceramic part 901, a second ceramic part 902, and a third ceramic part 903. The first ceramic part 901 is the lower part of the porous part 90 and includes the first surface 90*a*. The second ceramic part 902 is the upper part of the porous part 90 and includes the second surface 90*b*. The third ceramic part 903 is positioned between the first ceramic part 901 and the second ceramic part 902 in the Z-direction. In other words, the Z-direction position of the third ceramic part 903 is between the Z-direction position of the first ceramic part 901 and the Z-direction position of the second ceramic part 902.

A length t901 along the second direction of the first ceramic part 901 is less than a length t902 along the second direction of the second ceramic part 902. The length t901 along the second direction of the first ceramic part 901 is less than a length t903 along the second direction of the third ceramic part 903. For example, the length t901 is the diameter of the first ceramic part 901 and is the maximum width of the planar shape of the first ceramic part 901. The length t902 is, for example, the diameter of the second ceramic part 902 and is the maximum width of the planar shape of the second ceramic part 902. The length t903 is, for example, the diameter of the third ceramic part 903 and is the maximum width of the planar shape of the third ceramic part 903.

For example, the side surface (the outer circumferential surface crossing the XY plane) of the first ceramic part 901 is sloped with respect to the Z-direction. In such a case, the length t901 of the first ceramic part 901 changes along the Z-direction and, for example, monotonously decreases downward. For example, the side surface of the second ceramic part 902 extends along the Z-direction. In such a case, the length t902 of the second ceramic part 902 is constant along the Z-direction. For example, the side surface of the third ceramic part 903 also is sloped with respect to the Z-direction. In such a case, the length t903 of the third ceramic part 903 changes along the Z-direction and, for example, monotonously decreases downward.

In the example, the first ceramic part 901 and the third ceramic part 903 are circular frustum-shaped, and the second ceramic part 902 is cylindrical. For example, in the XY plane, the position of the center of the first ceramic part 901 is substantially the same as the position of the center of the second ceramic part 902.

The side surface of the first ceramic part 901 is, for example, the first side part 90s1 described above. The side surface of the second ceramic part 902 is, for example, the second side part 90s2. The side surface of the third ceramic part 903 is, for example, the third side part 90s3.

At least a part of the elastic body 30 overlaps the third ceramic part 903 in the Z-direction. In other words, at least a part of the elastic body 30 is arranged with the third ceramic part 903 in the Z-direction. In the example, the part of the ring-shaped elastic body 30 at the inner circumference overlaps the first ceramic part 901, the second ceramic part 902, and the third ceramic part 903 in the Z-direction. The part of the ring-shaped elastic body 30 at the outer circumference does not overlap the porous part 90 in the Z-direction. However, the entire elastic body 30 may overlap the porous part 90 in the Z-direction.

The elastic body 30 contacts at least one of the first ceramic part 901 or the third ceramic part 903. In the example, the elastic body 30 contacts the sloped side surface of the first ceramic part 901.

For example, the length t902 along the second direction of the second ceramic part 902 is substantially equal to the length ts along the second direction of the counterbore part 53s. Specifically, one second-direction end of the second ceramic part 902 and the other second-direction end of the second ceramic part 902 each contact the counterbore part 53s (the inner circumferential surface of the ceramic dielectric substrate 11 forming the counterbore part 53s). For example, the outer diameter (the length t902) of the second ceramic part 902 is substantially equal to the inner diameter (the length ts) of the counterbore part 53s. Thereby, the suppression effect of the arcing can be maintained for a long period of time because there is substantially no gap between the counterbore part 53s and the second ceramic part 902 of the ceramic porous part 90 most proximate to the plasma. "Substantially the same", "the same", "substantially equal", and "equal" are not limited to exactly the same or equal and may include, for example, differences in ranges caused by manufacturing fluctuation or play in manufacturing (e.g., a slight gap for disposing the porous part inside the counterbore part, etc.).

Figure 9:
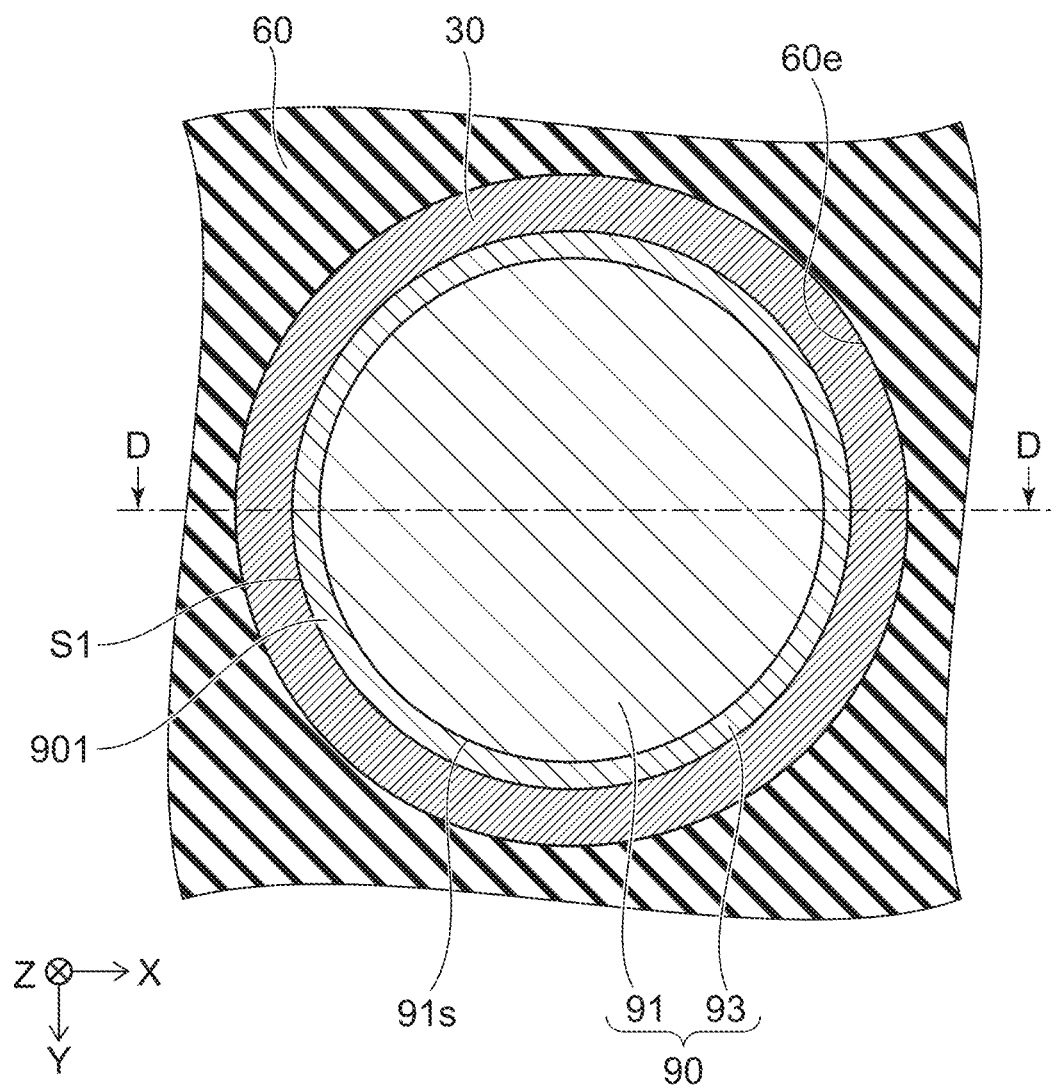
FIG. 9 is a schematic cross-sectional view illustrating the electrostatic chuck according to the embodiment.

FIG. 9 is a schematic cross-sectional view illustrating the electrostatic chuck according to the embodiment.

FIG. 9 is a cross section along line C-C shown in FIG. 8. FIG. 8 corresponds to a cross section along line D-D of FIG. 9. Line D-D passes through the center of the planar shape of the porous part 90.

For example, the first porous portion 91 is cylindrical. The first dense portion 93 contacts an outer circumference side surface 91s of the first porous portion 91. The first dense portion 93 has a ring shape (a tube shape) surrounding the outer circumference side surface 91s of the first porous portion 91.

As illustrated in FIG. 9, the inner circumference of the ring-shaped elastic body 30 may contact the first sloped part S1 over the entire circumference of the ring shape. Also, the outer circumference of the ring-shaped elastic body 30 may contact the end part 60e of the bonding part 60 over the entire circumference of the ring shape.

Figure 10:
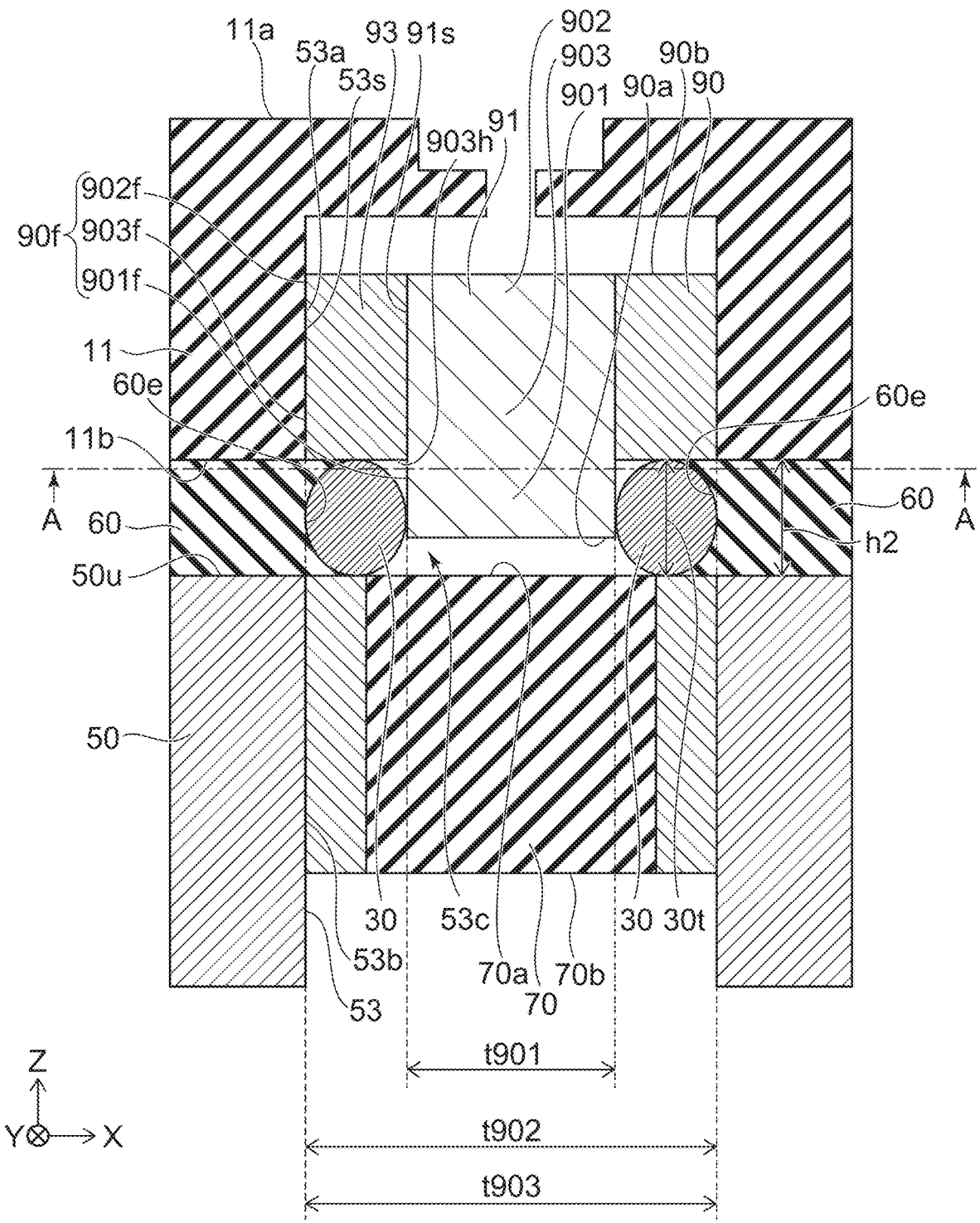
FIG. 10 is a schematic cross-sectional view illustrating the electrostatic chuck according to the embodiment.

FIG. 10 is a schematic cross-sectional view illustrating the electrostatic chuck according to the embodiment.

FIG. 10 is a schematic cross-sectional view illustrating a part of an electrostatic chuck similar to FIG. 1. However, the shape and the like of the porous part 90 of the example are different from those of the example described above. The gas inlet path 53 that includes the first hole part 53a, the second hole part 53b, and the third hole part 53c is included in the example as well. The first hole part 53a includes the counterbore part 53s. A part of the porous part 90 is located inside the counterbore part 53s. The elastic body 30 faces the end part of the bonding part 60 at the third hole part 53c side. The elastic body 30 is arranged with the bonding part 60 in the second direction.

As illustrated in FIG. 10, the porous part 90 includes the first ceramic part 901, the second ceramic part 902, and the third ceramic part 903. In the example as well, the length t901 along the second direction of the first ceramic part 901 is less than the length t902 along the second direction of the second ceramic part 902. The length t901 along the second direction of the first ceramic part 901 is less than the length t903 along the second direction of the third ceramic part 903.

The porous part 90 includes a side surface 90f. The side surface 90f is an outer circumferential surface crossing the XY plane. The side surface 90f includes a side surface 901f of the first ceramic part 901, a side surface 902f of the second ceramic part 902, and a side surface 903f of the third ceramic part 903. The side surface 901f faces a direction crossing the Z-direction (e.g., a direction perpendicular to the Z-direction) and extends along, for example, the Z-direction. The side surface 902f faces a direction crossing the Z-direction. The side surface 903f faces a direction crossing the Z-direction (e.g., a direction perpendicular to the Z-direction) and extends along, for example, the Z-direction. The side surface 901f, the side surface 902f, and the side surface 903f each may be parallel to the Z-direction. The side surface 901f, the side surface 902f, and the side surface 903f each may be sloped with respect to the Z-direction.

In the example, the porous part 90 includes a step located between the side surface 901f of the first ceramic part 901 and the side surface 903f of the third ceramic part 903. Specifically, the third ceramic part 903 includes an extension surface 903h extending along the second direction. For example, the extension surface 903h is parallel to the XY plane. The extension surface 903h connects the side surface 901f and the side surface 903f. The extension surface 903h is the lower surface of the third ceramic part 903 and faces downward. The first ceramic part 901 is a protrusion protruding downward from the central part of the lower surface (the extension surface 903h) of the third ceramic part 903. For example, the first ceramic part 901, the second ceramic part 902, and the third ceramic part 903 each are cylindrical. The second ceramic part 902 may be circular frustum-shaped.

The first surface 90a of the porous part 90 is arranged with the elastic body 30 and the bonding part 60 when viewed along the second direction. In other words, the elastic body 30 is arranged with the bonding part 60 and the first surface 90a in the second direction.

At least a part of the elastic body 30 overlaps the third ceramic part 903 in the Z-direction. In the example, the entire ring-shaped elastic body 30 overlaps the third ceramic part 903 in the Z-direction.

The elastic body 30 contacts at least one of the first ceramic part 901 or the third ceramic part 903. In the example of FIG. 10, the upper surface (the upper end part) of the elastic body 30 contacts the extension surface 903h of the third ceramic part 903. The side surface (the inner circumferential surface) of the elastic body 30 may contact the side surface 901f of the first ceramic part 901. For example, the lower surface (the lower end part) of the elastic body 30 contacts the porous part 70 (or the base plate 50).

Thus, according to the embodiment, at least a part of the elastic body 30 overlaps the third ceramic part 903 in the Z-direction, and the elastic body 30 contacts at least one of the first ceramic part 901 or the third ceramic part 903. Thereby, damage of the ceramic porous part 90 can be suppressed by the elastic body 30 absorbing the deformation of the ceramic porous part 90 due to heat. Therefore, the suppression effect of the arcing can be maintained for a long period of time.

The first surface 90a overlaps the bonding part 60 and the elastic body 30 when viewed along the second direction. That is, a part of the first ceramic part 901 is located in the third hole part 53c. The arcing resistance can be increased thereby. Because the elastic body 30 is located in the third hole part 53c to face the end part 60e of the bonding part 60, the generation of particles due to the end part 60e being corroded by the plasma when the electrostatic chuck is used can be suppressed.

A length 30t along the Z-direction of the elastic body 30 is, for example, equal to a length h2 along the Z-direction of the bonding part 60. Thereby, for example, even when particles are generated from the bonding part 60, the particles can be prevented from reaching the porous part 90. The length 30t may be greater than the length h2.

Figure 11:
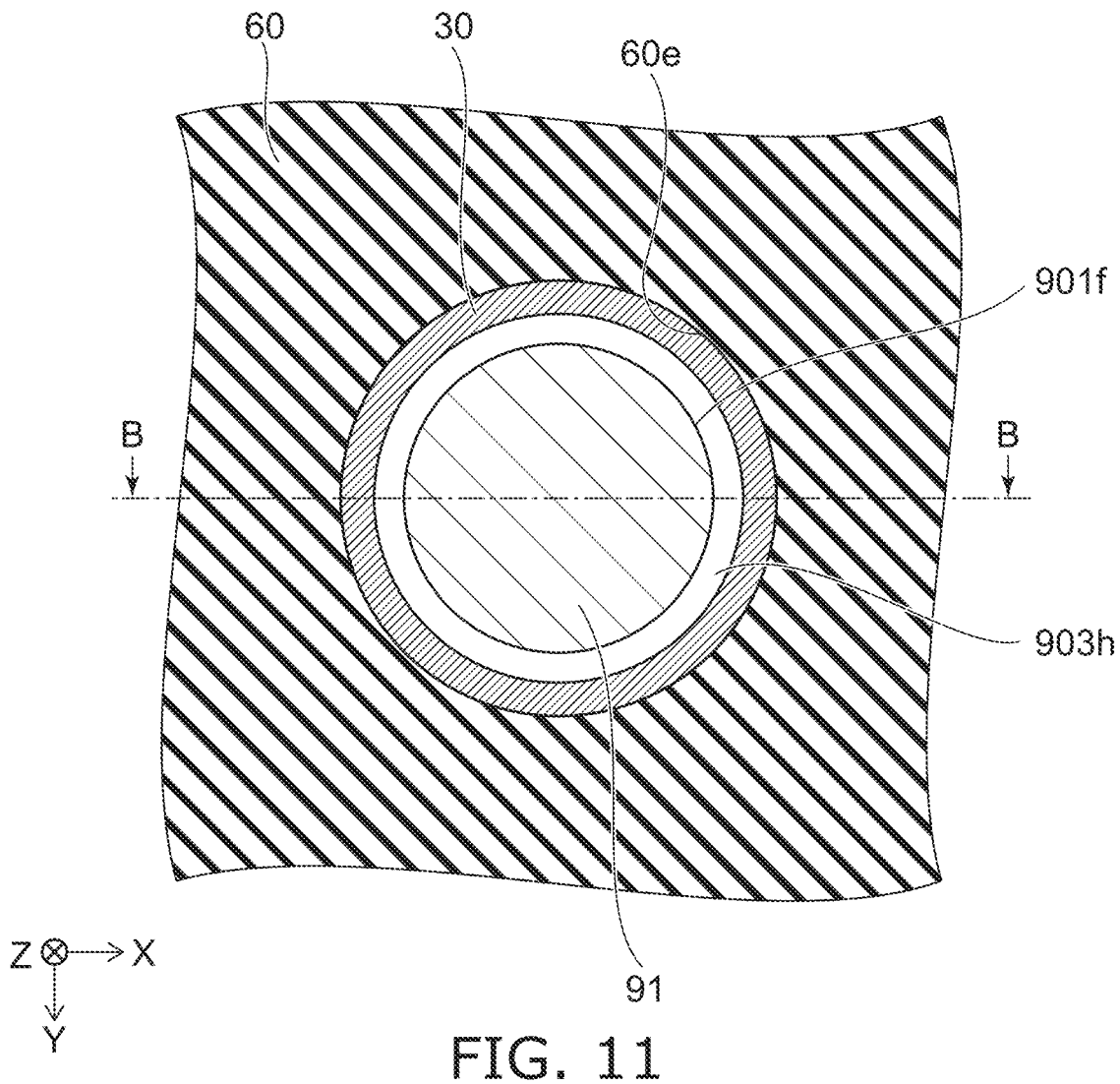
FIG. 11 is a schematic cross-sectional view illustrating the electrostatic chuck according to the embodiment.

FIG. 11 is a schematic cross-sectional view illustrating the electrostatic chuck according to the embodiment.

FIG. 11 is a cross section along line A-A shown in FIG. 10. FIG. 10 corresponds to a cross section along line B-B of FIG. 11. Line B-B passes through the center of the planar shape of the porous part 90.

The porous part 90 includes the first porous portion 91 and the first dense portion 93.

The first porous portion 91 is, for example, cylindrical. The first dense portion 93 contacts the outer circumference side surface 91s of the first porous portion 91. The first dense portion 93 has a ring shape (a tube shape) surrounding the outer circumference side surface 91s of the first porous portion 91.

The elastic body 30 contacts the first dense portion 93. For example, the extension surface 903h of the third ceramic part 903 is included in the first dense portion 93. Although the side surface 901f of the first ceramic part 901 is included in the first porous portion 91 in the example, the side surface 901f may be included in the first dense portion 93. The strength of at least one of the first ceramic part 901 or the third ceramic part 903 contacting the elastic body is increased thereby; therefore, damage of the ceramic porous part can be effectively suppressed, and the reduction effect of the arcing can be maintained for a long period of time.

The upper surface of the ring-shaped elastic body 30 may contact the extension surface 903h of the third ceramic part 903 over the entire circumference of the ring shape. The inner circumference side surface of the ring-shaped elastic body 30 may contact the side surface 901f of the first ceramic part 901 over the entire circumference of the ring shape.

Figure 12:
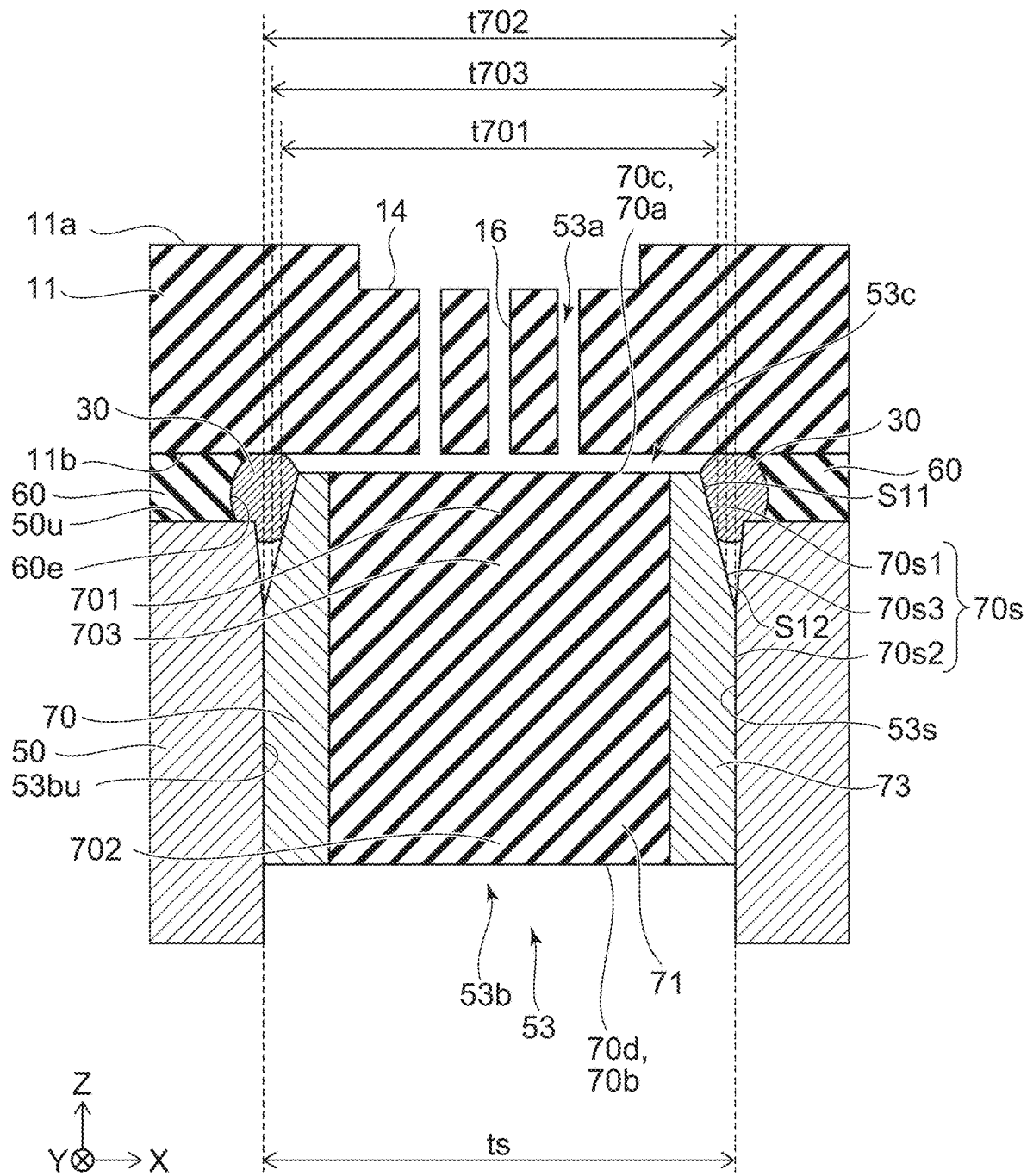
FIG. 12 is a schematic cross-sectional view illustrating the electrostatic chuck according to the embodiment.

FIG. 12 is a schematic cross-sectional view illustrating the electrostatic chuck according to the embodiment.

FIG. 12 is a schematic cross-sectional view illustrating a part of an electrostatic chuck similar to FIG. 1. However, the shapes and the like of the porous part 70 and its periphery in the example are different from those of the example described above.

For example, FIG. 12 is a cross section that is parallel to the Z-direction and passes through the center of the planar shape of the porous part 70. As illustrated in FIG. 12, the gas inlet path 53 that extends through the ceramic dielectric substrate 11, the base plate 50, and the bonding part 60 is provided. The gas inlet path 53 includes the first hole part 53a, the second hole part 53b, and the third hole part 53c.

The first hole part 53a includes multiple pores 16 arranged in the second direction. The pores 16 extend in the Z-direction from the third hole part 53c to the groove 14.

The second hole part 53b includes the third part 53bu and the fourth part 53bd. In the example, the third part 53bu includes the counterbore part 53s. In other words, in the example, the counterbore part 53s is located in the second hole part 53b. The counterbore part 53s may not be located in the first hole part 53a. The upper end of the third part 53bu is located at the upper surface 50u of the base plate 50. The upper end of the counterbore part 53s is located at the upper surface 50u. For example, the fourth part 53bd is connected to the lower end of the counterbore part 53s. The lower end of the fourth part 53bd is located at the lower surface 50d of the base plate 50.

For example, the shapes in the XY plane of the outer circumferences of the third part 53bu, the fourth part 53bd, and the counterbore part 53s are circular. The length ts along the second direction of the counterbore part 53s is greater than the length along the second direction of the fourth part 53bd. The length along the second direction of the fourth part 53bd is, for example, the diameter of the fourth part 53bd and is the maximum width of the planar shape of the fourth part 53bd. For example, the counterbore part 53s is at least a portion of a part of the second hole part 53b having a greater diameter than the lower part (e.g., the fourth part 53bd). For example, in the XY plane, the position of the center of the counterbore part 53s is substantially the same as the position of the center of the fourth part 53bd.

A part of the porous part 70 is located in the counterbore part 53s. The porous part 70 includes a first surface 70c (e.g., the third surface 70a) at the third hole part 53c side and a second surface 70d (e.g., the fourth surface 70b) at the side opposite to the first surface 70c. The first surface 70c of the porous part 70 is the upper surface at the ceramic dielectric substrate 11 side; and the second surface 70d is the lower surface. For example, the first surface 70c and the second surface 70d extend along the XY plane and are substantially planes. A space is formed between the first surface 70c and the ceramic dielectric substrate 11.

The elastic body 30 faces the end part 60e of the bonding part 60 at the third hole part 53c side. In the example, the elastic body 30 contacts the end part 60e. The elastic body 30 is arranged with the bonding part 60 and the first surface 70c in the second direction. In other words, the first surface 70c overlaps the bonding part 60 and the elastic body 30 when viewed along the second direction. The elastic body 30 is positioned between the first surface 70c and the end part 60e of the bonding part 60. The bonding part 60 is thereby protected by suppressing exposure to plasma and/or gas. For example, the elastic body 30 isolates the bonding part 60 from the space between the first surface 70c and the ceramic dielectric substrate 11. For example, the elastic body 30 is located so that the bonding part 60 does not directly contact the space of the gas inlet path 53 through which the gas can pass.

The porous part 70 includes a side surface 70s. The side surface 70s is the outer circumferential surface crossing the XY plane. The side surface 70s connects the first surface 70c and the second surface 70d. The side surface 70s includes a first side part 70s1 at the first surface 70c side, a second side part 70s2 at the second surface 70d side, and a third side part 70s3 between the first side part 70s1 and the second side part 70s2. A first sloped part S11 that is sloped with respect to the Z-direction is located in at least the region of the first side part 70s1 contacting the first surface 70c. In the example, the first side part 70s1 is made of the first sloped part S11. In other words, the first sloped part S11 contacts the first surface 70c and is sloped with respect to the Z-direction. The third side part 70s3 also includes a second sloped part S12 sloped with respect to the Z-direction. For example, the second sloped part S12 is continuous with the first sloped part S11. That is, the first sloped part S11 and the second sloped part S12 is located continuously from the first surface 70c side of the porous part 70. A fixing part may be located between the second sloped part S12 and the counterbore part 53s.

The porous part 70 includes a first ceramic part 701, a second ceramic part 702, and a third ceramic part 703. The first ceramic part 701 is the upper part of the porous part 70 and includes the first surface 70c. The second ceramic part 702 is the lower part of the porous part 90 and includes the second surface 70d. In the Z-direction, the third ceramic part 703 is positioned between the first ceramic part 701 and the second ceramic part 702. In other words, the Z-direction position of the third ceramic part 703 is between the Z-direction position of the first ceramic part 701 and the Z-direction position of the second ceramic part 702.

A length t701 along the second direction of the first ceramic part 701 is less than a length t702 along the second direction of the second ceramic part 702. The length t701 along the second direction of the first ceramic part 701 is less than a length t703 along the second direction of the third ceramic part 703. The length t701 is, for example, the diameter of the first ceramic part 701 and is the maximum width of the planar shape of the first ceramic part 701. The length t702 is, for example, the diameter of the second ceramic part 702 and is the maximum width of the planar shape of the second ceramic part 702. The length t703 is, for example, the diameter of the third ceramic part 703 and is the maximum width of the planar shape of the third ceramic part 703.

The side surface of the first ceramic part 701 is sloped with respect to the Z-direction. In such a case, the length t701 of the first ceramic part 701 changes along the Z-direction and, for example, monotonously decreases upward. For example, the side surface of the second ceramic part 702 extends along the Z-direction. In such a case, the length t702 of the second ceramic part 702 is constant along the Z-direction. For example, the side surface of the third ceramic part 703 is sloped with respect to the Z-direction. In such a case, the length t703 of the third ceramic part 703 changes along the Z-direction and, for example, monotonously decreases upward.

In the example, the first ceramic part 701 and the third ceramic part 703 are circular frustum-shaped; and the second ceramic part 702 is cylindrical. For example, in the XY plane, the position of the center of the first ceramic part 701 is substantially the same as the position of the center of the second ceramic part 702.

The side surface of the first ceramic part 701 is, for example, the first side part 70s1. The side surface of the second ceramic part 702 is, for example, the second side part 70s2. The side surface of the third ceramic part 703 is, for example, the third side part 70s3.

At least a part of the elastic body 30 overlaps the third ceramic part 703 in the Z-direction. In other words, at least a part of the elastic body 30 is arranged with the third ceramic part 703 in the Z-direction. In the example, the part of the ring-shaped elastic body 30 at the inner circumference overlaps the first ceramic part 701, the second ceramic part 702, and the third ceramic part 703 in the Z-direction. The part of the ring-shaped elastic body 30 at the outer circumference does not overlap the porous part 70 in the Z-direction. However, the entire elastic body 30 may overlap the porous part 70 in the Z-direction.

The elastic body 30 contacts at least one of the first ceramic part 701 or the third ceramic part 903. In the example, the elastic body 30 contacts the sloped side surface of the first ceramic part 901. In other words, the porous part 70 contacts the elastic body 30 at the first sloped part S11.

As described above, at least a part of the elastic body 30 overlaps the third ceramic part 703 in the Z-direction; and the elastic body 30 contacts at least one of the first ceramic part 701 or the third ceramic part 703. Thereby, damage of the ceramic porous part 70 can be suppressed by the elastic body 30 absorbing the deformation of the ceramic porous part 70 due to heat. Therefore, the suppression effect of the arcing can be maintained for a long period of time.

The first surface 70c overlaps the bonding part 60 and the elastic body 30 when viewed along the second direction. That is, a part of the first ceramic part 701 is located in the third hole part 53c. The arcing resistance can be increased thereby. Because the elastic body 30 is located in the third hole part 53c to face the end part 60e of the bonding part 60, the generation of particles due to the end part 60e being corroded by the plasma when the electrostatic chuck is used can be suppressed.

For example, the length t702 along the second direction of the second ceramic part 702 is substantially equal to the length ts along the second direction of the counterbore part 53s. Specifically, one second-direction end of the second ceramic part 702 and the other second-direction end of the second ceramic part 702 each contact the counterbore part 53s (the inner circumferential surface of the base plate 50 forming the counterbore part 53s). For example, the outer diameter (the length t702) of the second ceramic part 702 is substantially equal to the inner diameter (the length ts) of the counterbore part 53s. The gap between the ceramic porous part 70 and the counterbore part 53s can be suppressed thereby; therefore, the suppression effect of the arcing can be maintained for a long period of time.

For example, the second porous portion 71 is cylindrical. The second dense portion 73 contacts the outer circumference side surface of the second porous portion 71. The second dense portion 73 has a ring shape (a tube shape) surrounding the outer circumference side surface of the second porous portion 71. The inner circumference of the ring-shaped elastic body 30 may contact the first sloped part S11 over the entire circumference of the ring shape. The outer circumference of the ring-shaped elastic body 30 may contact the end part 60e of the bonding part 60 over the entire circumference of the ring shape.

Figure 13:
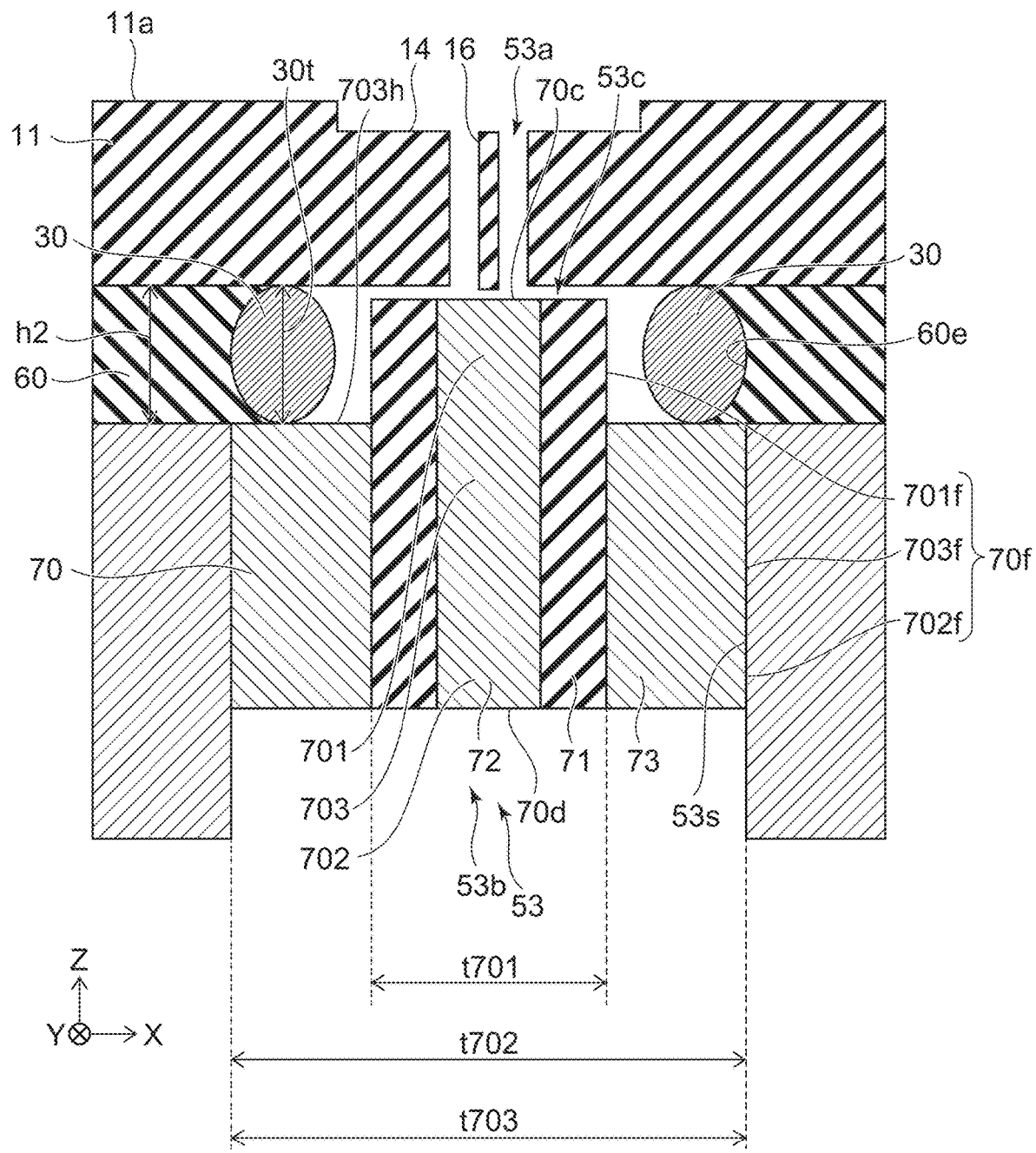
FIG. 13 is a schematic cross-sectional view illustrating the electrostatic chuck according to the embodiment.

FIG. 13 is a schematic cross-sectional view illustrating the electrostatic chuck according to the embodiment.

FIG. 13 is a schematic cross-sectional view illustrating a part of an electrostatic chuck similar to FIG. 1. However, the shapes and the like of the porous part 70 and its periphery in the example are different from those of the example described above. For example, FIG. 13 is a cross section that is parallel to the Z-direction and passes through the center of the planar shape of the porous part 70. The gas inlet path 53 that includes the first hole part 53a, the second hole part 53b, and the third hole part 53c is included in the example as well. The second hole part 53b includes the counterbore part 53s. A part of the porous part 70 is located inside the counterbore part 53s. The elastic body 30 faces the end part of the bonding part 60 at the third hole part 53c side. The elastic body 30 is arranged with the bonding part 60 in the second direction.

As illustrated in FIG. 13, the porous part 70 includes the first ceramic part 701, the second ceramic part 702, and the third ceramic part 703. In the example as well, the length t701 along the second direction of the first ceramic part 701 is less than the length t702 along the second direction of the second ceramic part 702. The length t701 along the second direction of the first ceramic part 701 is less than the length t703 along the second direction of the third ceramic part 703.

The porous part 70 includes a side surface 70f. The side surface 70f is the outer circumferential surface crossing the XY plane. The side surface 70f includes a side surface 701f of the first ceramic part 701, a side surface 702f of the second ceramic part 702, and a side surface 703f of the third ceramic part 703. The side surface 701f faces a direction crossing the Z-direction (e.g., a direction perpendicular to the Z-direction) and extends along, for example, the Z-direction. The side surface 702f faces a direction crossing the Z-direction. The side surface 703f faces a direction crossing the Z-direction (e.g., a direction perpendicular to the Z-direction) and extends along, for example, the Z-direction. The side surface 701f, the side surface 702f, and the side surface 703f each may be parallel to the Z-direction. The side surface 701f, the side surface 702f, and the side surface 703f each may be sloped with respect to the Z-direction.

In the example, the porous part 70 includes a step located between the side surface 701f of the first ceramic part 701 and the side surface 703f of the third ceramic part 703. Specifically, the third ceramic part 703 includes an extension surface 703h extending along the second direction. For example, the extension surface 703h is parallel to the XY plane. The extension surface 703h connects the side surface 701f and the side surface 703f. The extension surface 703h is the upper surface of the third ceramic part 703 and faces upward. The first ceramic part 701 is a protrusion protruding upward from the central part of the upper surface (the extension surface 703h) of the third ceramic part 703. For example, the first ceramic part 701, the second ceramic part 702, and the third ceramic part 703 each are cylindrical. The second ceramic part 702 may be circular frustum-shaped.

The first surface 70c of the porous part 70 is arranged with the elastic body 30 and the bonding part 60 when viewed along the second direction. In other words, the elastic body 30 is arranged with the bonding part 60 and the first surface 70c in the second direction.

At least a part of the elastic body 30 overlaps the third ceramic part 703 in the Z-direction. In the example, the entire ring-shaped elastic body 30 overlaps the third ceramic part 703 in the Z-direction.

The elastic body 30 contacts at least one of the first ceramic part 701 or the third ceramic part 703. In the example of FIG. 13, the lower surface of the elastic body 30 contacts the extension surface 703h of the third ceramic part 703. The side surface (the inner circumferential surface) of the elastic body 30 may contact the side surface 701f of the first ceramic part 701. For example, the upper surface of the elastic body 30 contacts the ceramic dielectric substrate 11.

Thus, according to the embodiment, at least a part of the elastic body 30 overlaps the third ceramic part 703 in the Z-direction; and the elastic body 30 contacts at least one of the first ceramic part 701 or the third ceramic part 703. Thereby, damage of the ceramic porous part 70 can be suppressed by the elastic body 30 absorbing the deformation of the ceramic porous part 70 due to heat. Therefore, the suppression effect of the arcing can be maintained for a long period of time.

The first surface 70c overlaps the bonding part 60 and the elastic body 30 when viewed along the second direction. That is, a part of the first ceramic part 701 is located in the third hole part 53c. The arcing resistance can be increased thereby. Because the elastic body 30 is located in the third hole part 53c to face the end part 60e of the bonding part 60, the generation of particles due to the end part 60e being corroded by the plasma when the electrostatic chuck is used can be suppressed.

The length 30t along the Z-direction of the elastic body 30 is, for example, equal to the length h2 along the Z-direction of the bonding part 60. The length 30t may be greater than the length h2. For example, a force in the Z-direction is applied to the elastic body 30 by the extension surface 703h of the third ceramic part 703 and the ceramic dielectric substrate 11. The elastic body 30 may have compressive deformation in the Z-direction. In other words, the length 30t of the elastic body 30 may be less than the equilibrium length of the elastic body 30 (the Z-direction length when pressure due to the ceramic dielectric substrate 11 and the porous part is not applied). For example, even when particles are generated from the bonding part 60, the particles can be prevented from reaching the porous part 70.

The porous part 70 includes the second porous portion 71, the second dense portion 73, and a dense portion 72. The dense portion 72 is, for example, cylindrical. The dense portion 72 is more dense than the second porous portion 71. The porosity of the second porous portion 71 is greater than the porosity of the dense portion 72. For example, the density of the second porous portion 71 is less than the density of the dense portion 72. The gas permeability of the second porous portion 71 is greater than the gas permeability of the dense portion 72. The dense portion 72 may be substantially gas-impermeable. The second porous portion 71 contacts the outer circumference side surface of the dense portion 72. The second porous portion 71 has a ring shape (a tube shape) surrounding the outer circumference side surface of the dense portion 72. The second porous portion 71 is, for example, cylindrical when the dense portion 72 is not included. The second dense portion 73 contacts the outer circumference side surface of the second porous portion 71.

The second dense portion 73 has a ring shape (a tube shape) surrounding the outer circumference side surface of the second porous portion 71.

The elastic body 30 contacts the second dense portion 73. For example, the side surface 701$f$ of the first ceramic part 701 and the extension surface 703$h$ of the third ceramic part 703 each are included in the second dense portion 73. The strength of at least one of the first ceramic part 701 or the third ceramic part 703 contacting the elastic body is further increased thereby; therefore, damage of the ceramic porous part can be effectively suppressed, and the reduction effect of the arcing can be maintained for a long period of time.

The lower surface of the ring-shaped elastic body 30 may contact the extension surface 703$h$ of the third ceramic part 703 over the entire circumference of the ring shape. The inner circumference side surface of the ring-shaped elastic body 30 may contact the side surface 701$f$ of the first ceramic part 701 over the entire circumference of the ring shape.

Embodiments may include the following configurations.

Configuration 1

An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including
a first hole part positioned at the ceramic dielectric substrate,
a second hole part positioned at the base plate, and
a third hole part positioned at the bonding part;
a counterbore part located in the first hole part;
a ceramic porous part located in the counterbore part, the ceramic porous part including
a first surface at the third hole part side, and
a second surface at a side opposite to the first surface; and
an elastic body facing an end part of the bonding part at the third hole part side,
the ceramic porous part further including a side surface connecting the first surface and the second surface,
the side surface including
a first side part at the first surface side,
a second side part at the second surface side, and
a third side part between the first side part and the second side part,
a first direction being a direction from the base plate toward the ceramic dielectric substrate,
a second direction being a direction substantially orthogonal to the first direction,
a first sloped part being provided in at least a region of the first side part contacting the first surface,
the first sloped part being sloped with respect to the first direction,
the first surface overlapping the bonding part and the elastic body when viewed along the second direction,
the ceramic porous part being configured to contact the elastic body at the first sloped part.

Configuration 2

The chuck according to configuration 1, wherein
the ceramic porous part includes:
a porous portion that is gas-permeable; and
a dense portion that is denser than the porous portion,
the dense portion covers an outer circumference of the porous portion, and
the first sloped part is provided in the dense portion.

Configuration 3

The chuck according to configuration 1 or 2, wherein
the first side part is made of the first sloped part.

Configuration 4

The chuck according to configuration 3, wherein
a second sloped part is provided in at least a part of the third side part and is continuous with the first sloped part, and
a fixing part fixes the ceramic porous part to the counterbore part between the counterbore part and the second sloped part.

Configuration 5

The chuck according to configuration 4, wherein
a length along the second direction of the second side part is substantially equal to a length along the second direction of the counterbore part.

Configuration 6

The chuck according to any one of configurations 1 to 5, wherein
a length along the first direction of a part of the elastic body contacting the first sloped part is greater than a length along the first direction of the bonding part.

Configuration 7

The chuck according to any one of configurations 1 to 6, wherein
the elastic body is ring-shaped, and
the first surface is surrounded with the elastic body when viewed along the first direction.

Configuration 8

The chuck according to any one of configurations 1 to 7, wherein
the elastic body includes at least one of polytetrafluoroethylene or polyimide.

Configuration 9

A processing apparatus, comprising:
the chuck according to any one of configurations 1 to 8; and
a supply part configured to supply a gas to the gas inlet path of the chuck.

Configuration 10

An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including a first hole part positioned at the ceramic dielectric substrate,
a second hole part positioned at the base plate, and
a third hole part positioned at the bonding part;
a counterbore part provided in the first hole part or the second hole part;
a ceramic porous part located in the counterbore part, the ceramic porous part including
a first surface at the third hole part side, and
a second surface at a side opposite to the first surface; and
an elastic body facing an end part of the bonding part at the third hole part side,
a first direction being a direction from the base plate toward the ceramic dielectric substrate,
a second direction being a direction orthogonal to the first direction,
the ceramic porous part including
a first ceramic part including the first surface,
a second ceramic part including the second surface, and
a third ceramic part positioned between the first ceramic part and the second ceramic part in the first direction,
a length along the second direction of the first ceramic part being less than a length along the second direction of the third ceramic part,
the first surface overlapping the bonding part and the elastic body when viewed along the second direction,
at least a part of the elastic body overlapping the third ceramic part in the first direction,
the elastic body contacting at least one of the first ceramic part or the third ceramic part.

Configuration 11
The chuck according to configuration 10, wherein
the ceramic porous part includes a side surface connecting the first surface and the second surface,
the side surface includes:
a first side part at the first surface side;
a second side part at the second surface side; and
a third side part between the first side part and the second side part,
a first sloped part is provided in at least a region of the first side part contacting the first surface,
the first sloped part is sloped with respect to the first direction, and
the ceramic porous part contacts the elastic body at the first sloped part.

Configuration 12
The chuck according to configuration 10, wherein
the third ceramic part includes an extension surface extending along the second direction, and
the elastic body contacts the extension surface.

Configuration 13
The chuck according to any one of configurations 10 to 12, wherein
the ceramic porous part includes:
a porous portion that is gas-permeable; and
a dense portion that is denser than the porous portion,
the dense portion covers an outer circumference of the porous portion, and
the elastic body contacts the dense portion.

Configuration 14
The chuck according to any one of configurations 10 to 13, wherein
a length along the second direction of the second ceramic part is substantially equal to a length along the second direction of the counterbore part.

Configuration 15
The chuck according to any one of configurations 10 to 14, wherein
the elastic body has compressive deformation in the first direction.

Configuration 16
The chuck according to any one of configurations 10 to 15, wherein
the elastic body is ring-shaped, and
the first surface is surrounded with the elastic body when viewed along the first direction.

Configuration 17
The chuck according to any one of configurations 10 to 16, wherein
the elastic body includes at least one of polytetrafluoroethylene or polyimide.

Configuration 18
A processing apparatus, comprising:
the chuck according to any one of configurations 10 to 17; and
a supply part configured to supply a gas to the gas inlet path of the chuck.

In this specification, "perpendicular", "parallel", and "orthogonal" include not only exactly perpendicular, exactly parallel, and exactly orthogonal but also, for example, the fluctuation due to manufacturing processes, etc.; and it is sufficient to be substantially perpendicular, substantially parallel, or substantially orthogonal.

The invention has been described with reference to the embodiments. However, the invention is not limited to these embodiments. Although a configuration that uses a Coulomb force is illustrated as the electrostatic chuck 110 as an example, a configuration that uses a Johnsen-Rahbek force also is applicable to the electrostatic chuck 110. Any design changes in the above embodiments suitably made by those skilled in the art are also encompassed within the scope of the invention as long as they fall within the spirit of the invention. The components included in the embodiments described above can be combined to the extent possible, and these combinations are also encompassed within the scope of the invention as long as they include the features of the invention.

What is claimed is:
1. An electrostatic chuck, comprising:
a ceramic dielectric substrate including
a first major surface on which an object of clamping is placed, and
a second major surface at a side opposite to the first major surface;
a base plate supporting the ceramic dielectric substrate, the base plate including
an upper surface at the ceramic dielectric substrate side, and
a lower surface at a side opposite to the upper surface;
a bonding part located between the ceramic dielectric substrate and the base plate;
a gas inlet path extending through the ceramic dielectric substrate, the base plate, and the bonding part, the gas inlet path including
a first hole part positioned at the ceramic dielectric substrate,
a second hole part positioned at the base plate, and
a third hole part positioned at the bonding part;
a counterbore part located in the first hole part;
a ceramic porous part located in the counterbore part, the ceramic porous part including
a first surface at the third hole part side, and a second surface at a side opposite to the first surface; and
an elastic body facing an end part of the bonding part at the third hole part side,
the ceramic porous part further including a side surface connecting the first surface and the second surface,
the side surface including
    a first side part at the first surface side,
    a second side part at the second surface side, and
    a third side part between the first side part and the second side part,
a first direction being a direction from the base plate toward the ceramic dielectric substrate,
a second direction being a direction substantially orthogonal to the first direction,
a first sloped part being provided in at least a region of the first side part contacting the first surface,
the first sloped part being sloped with respect to the first direction,
the first surface overlapping the bonding part and the elastic body when viewed along the second direction,
the ceramic porous part being configured to contact the elastic body at the first sloped part.

2. The chuck according to claim 1, wherein the ceramic porous part includes:
    a porous portion that is gas-permeable; and
    a dense portion that is denser than the porous portion,
the dense portion covers an outer circumference of the porous portion, and
the first sloped part is provided in the dense portion.

3. The chuck according to claim 1, wherein the first side part is made of the first sloped part.

4. The chuck according to claim 3, wherein
a second sloped part is provided in at least a part of the third side part and is continuous with the first sloped part, and
a fixing part fixes the ceramic porous part to the counterbore part between the counterbore part and the second sloped part.

5. The chuck according to claim 4, wherein
a length along the second direction of the second side part is substantially equal to a length along the second direction of the counterbore part.

6. The chuck according to claim 1, wherein
a length along the first direction of a part of the elastic body contacting the first sloped part is greater than a length along the first direction of the bonding part.

7. The chuck according to claim 1, wherein
the elastic body is ring-shaped, and
the first surface is surrounded with the elastic body when viewed along the first direction.

8. The chuck according to claim 1, wherein
the elastic body includes at least one of polytetrafluoroethylene or polyimide.

9. A processing apparatus, comprising:
the chuck according to claim 1; and
a supply part configured to supply a gas to the gas inlet path of the chuck.

10. An electrostatic chuck, comprising:
a ceramic dielectric substrate including
    a first major surface on which an object of clamping is placed, and
    a second major surface at a side opposite to the first major surface;
a base plate supporting the ceramic dielectric substrate, the base plate including
    an upper surface at the ceramic dielectric substrate side, and
    a lower surface at a side opposite to the upper surface;
a bonding part located between the ceramic dielectric substrate and the base plate;
a gas inlet path extending through the ceramic dielectric substrate, the base plate, and the bonding part, the gas inlet path including
    a first hole part positioned at the ceramic dielectric substrate,
    a second hole part positioned at the base plate, and
    a third hole part positioned at the bonding part;
a counterbore part provided in the first hole part or the second hole part;
a ceramic porous part located in the counterbore part, the ceramic porous part including
    a first surface at the third hole part side, and
    a second surface at a side opposite to the first surface; and
an elastic body facing an end part of the bonding part at the third hole part side,
a first direction being a direction from the base plate toward the ceramic dielectric substrate,
a second direction being a direction orthogonal to the first direction,
the ceramic porous part including
    a first ceramic part including the first surface,
    a second ceramic part including the second surface, and
    a third ceramic part positioned between the first ceramic part and the second ceramic part in the first direction,
a length along the second direction of the first ceramic part being less than a length along the second direction of the third ceramic part,
the first surface overlapping the bonding part and the elastic body when viewed along the second direction,
at least a part of the elastic body overlapping the third ceramic part in the first direction,
the elastic body contacting at least one of the first ceramic part or the third ceramic part.

11. The chuck according to claim 10, wherein
the ceramic porous part includes a side surface connecting the first surface and the second surface,
the side surface includes:
    a first side part at the first surface side;
    a second side part at the second surface side; and
    a third side part between the first side part and the second side part,
a first sloped part is provided in at least a region of the first side part contacting the first surface,
the first sloped part is sloped with respect to the first direction, and
the ceramic porous part contacts the elastic body at the first sloped part.

12. The chuck according to claim 10, wherein
the third ceramic part includes an extension surface extending along the second direction, and
the elastic body contacts the extension surface.

13. The chuck according to claim 10, wherein
the ceramic porous part includes:
    a porous portion that is gas-permeable; and
    a dense portion that is denser than the porous portion,
the dense portion covers an outer circumference of the porous portion, and
the elastic body contacts the dense portion.

14. The chuck according to claim 10, wherein
a length along the second direction of the second ceramic part is substantially equal to a length along the second direction of the counterbore part.
15. The chuck according to claim 10, wherein
the elastic body has compressive deformation in the first direction.
16. The chuck according to claim 10, wherein
the elastic body is ring-shaped, and
the first surface is surrounded with the elastic body when viewed along the first direction.
17. The chuck according to claim 10, wherein
the elastic body includes at least one of polytetrafluoroethylene or polyimide.
18. A processing apparatus, comprising:
the chuck according to claim 10; and
a supply part configured to supply a gas to the gas inlet path of the chuck.

* * * * *